United States Patent
Yang et al.

(10) Patent No.: US 9,035,683 B2
(45) Date of Patent: May 19, 2015

(54) CIRCUIT FOR CONTROLLING VARIATION IN FREQUENCY OF CLOCK SIGNAL

(71) Applicant: SILICON WORKS CO., LTD., Daejeon-si (KR)

(72) Inventors: Hong Jun Yang, Goyang-si (KR); Yong Hwan Moon, Incheon-si (KR); Sang Ho Kim, Gunpo-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 0 days.

(21) Appl. No.: 14/143,401

(22) Filed: Dec. 30, 2013

(65) Prior Publication Data

US 2014/0184291 A1 Jul. 3, 2014

(30) Foreign Application Priority Data

Dec. 28, 2012 (KR) .......................... 10-2012-0157255

(51) Int. Cl.
*H03L 7/06* (2006.01)
*H03L 7/085* (2006.01)

(52) U.S. Cl.
CPC ..................................... *H03L 7/085* (2013.01)

(58) Field of Classification Search
USPC .............. 327/141, 144–163; 331/1 A, 15–17; 375/373–376
See application file for complete search history.

(56) References Cited

U.S. PATENT DOCUMENTS

| | | | |
|---|---|---|---|
| 7,449,928 B2* | 11/2008 | Kobayashi .................... | 327/156 |
| 7,932,757 B2* | 4/2011 | Raghunathan et al. ....... | 327/158 |
| 8,368,438 B2* | 2/2013 | Furuta .......................... | 327/156 |
| 2004/0017872 A1* | 1/2004 | Boerstler et al. .............. | 375/375 |
| 2005/0073343 A1* | 4/2005 | Kim et al. ..................... | 327/156 |
| 2007/0188251 A1* | 8/2007 | Kobayashi ...................... | 331/46 |
| 2008/0169850 A1* | 7/2008 | Rombach ...................... | 327/157 |
| 2009/0285279 A1* | 11/2009 | Nathawad ..................... | 375/238 |

* cited by examiner

*Primary Examiner* — Brandon S Cole

(74) *Attorney, Agent, or Firm* — Kile Park Reed & Houtteman PLLC

(57) ABSTRACT

Disclosed herein is a circuit for controlling a variation in the frequency of a clock signal for blocking an unwanted variation in the frequency of the clock signal. When a frequency variation out of a set range is generated in a reference clock signal in the state in which the phases of the reference clock signal and a feedback clock signal have been locked, a control voltage for generating the feedback clock signal remains constant so that an abrupt variation generated in the frequency of the feedback clock signal is blocked.

19 Claims, 19 Drawing Sheets

Fig. 1
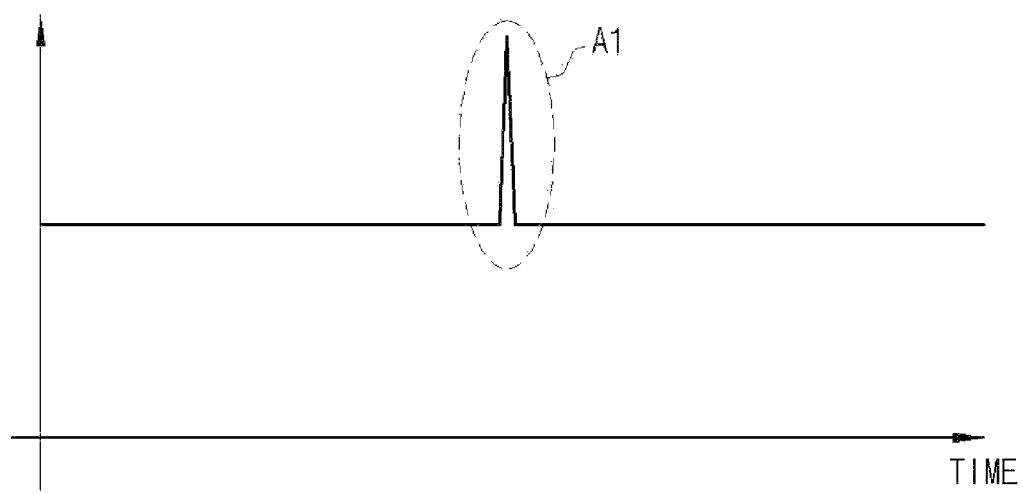
(a)
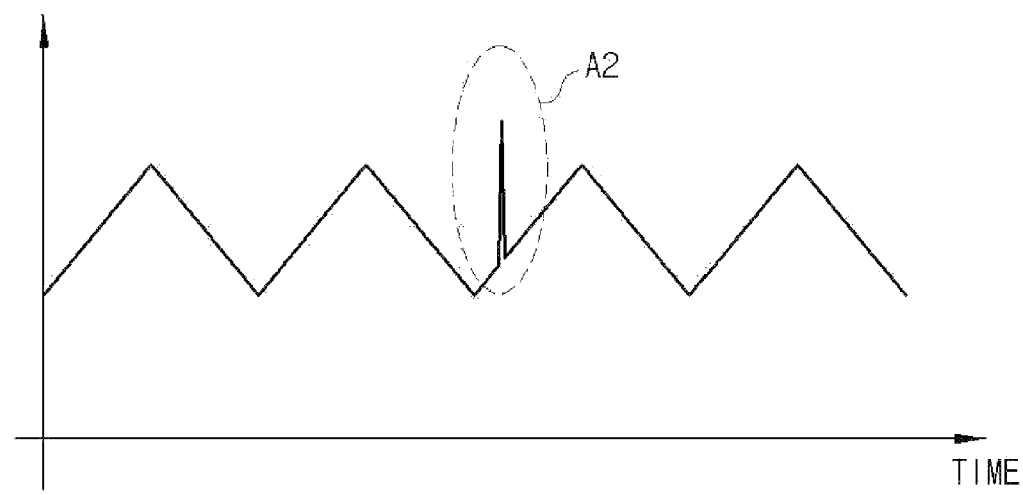
(b)

Fig. 3
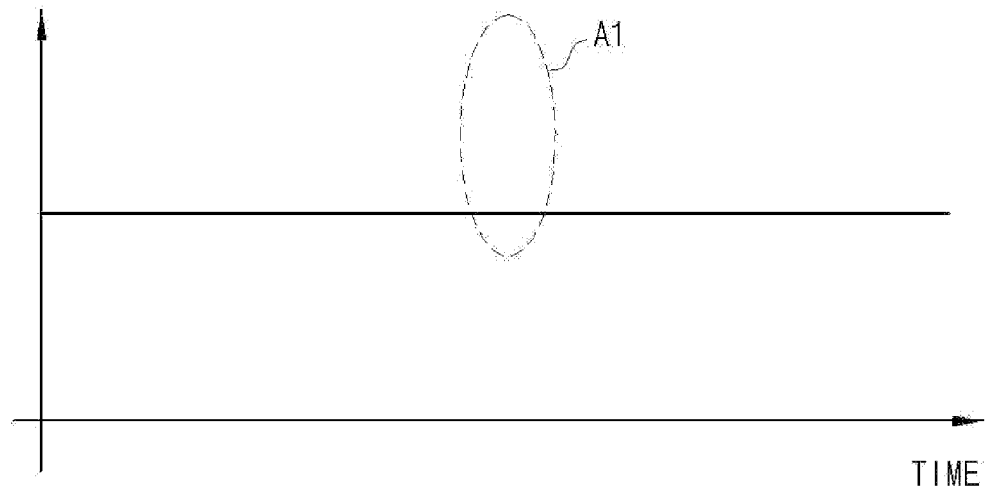
(a)
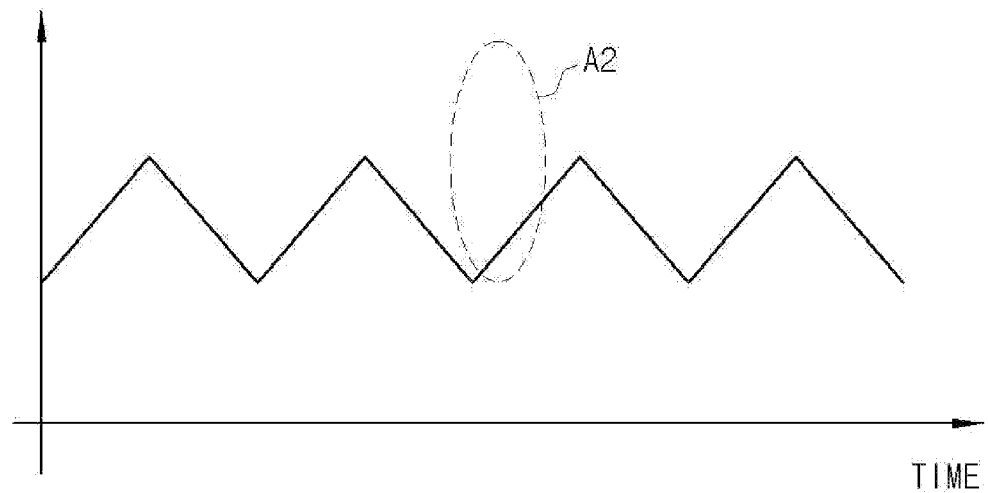
(b)

Fig. 11
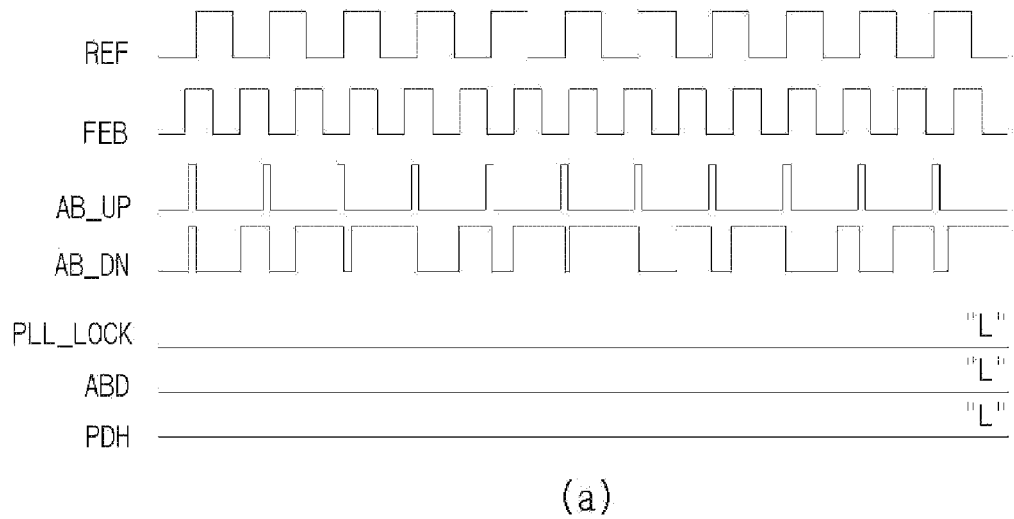
(a)
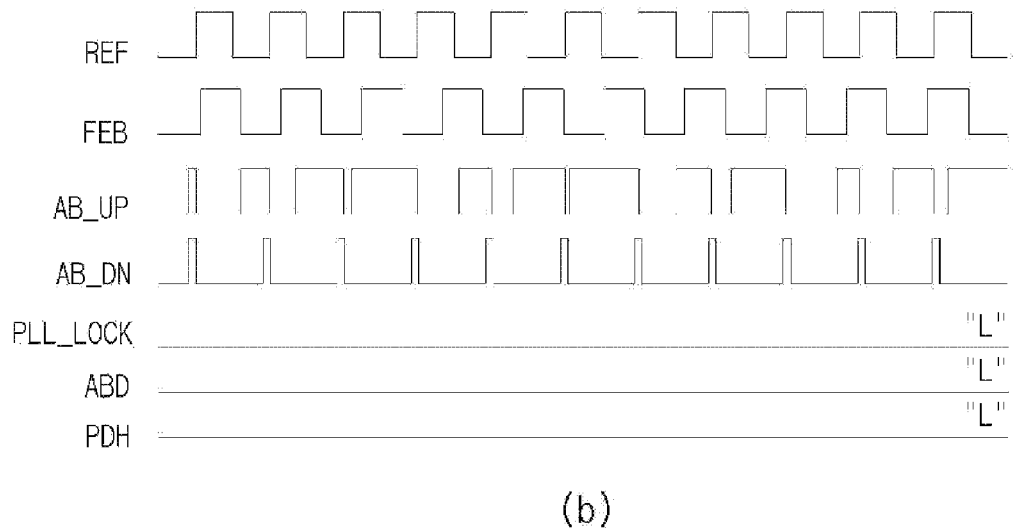
(b)

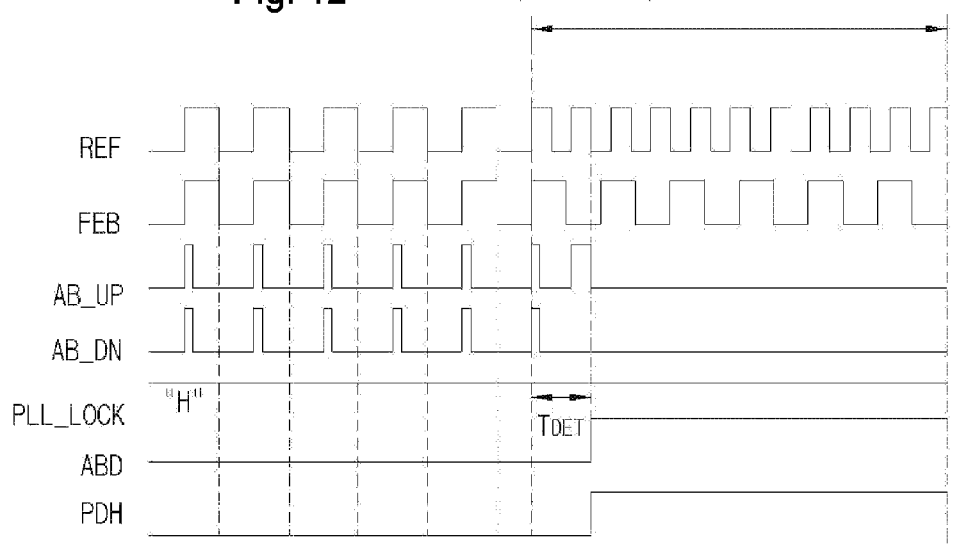
(a)
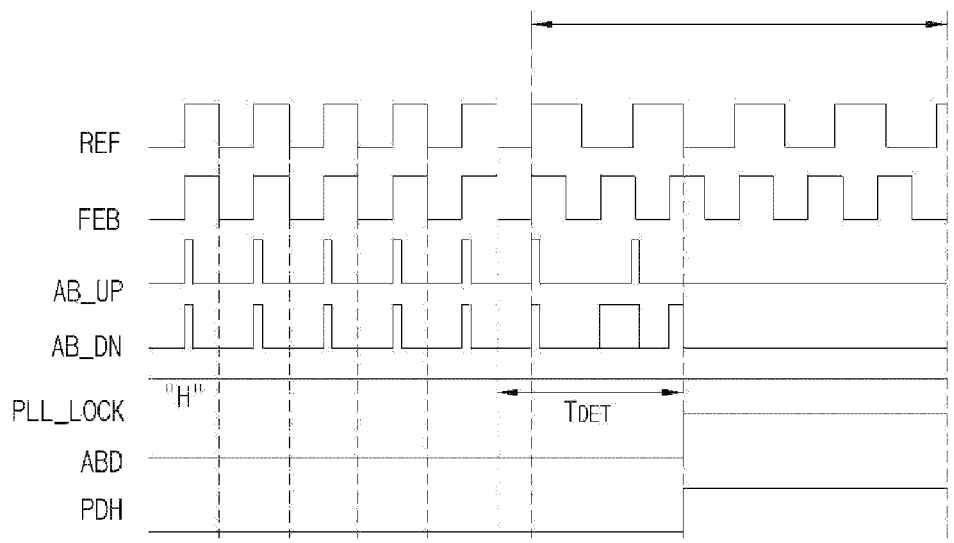
(b)
Fig. 12

Fig. 18
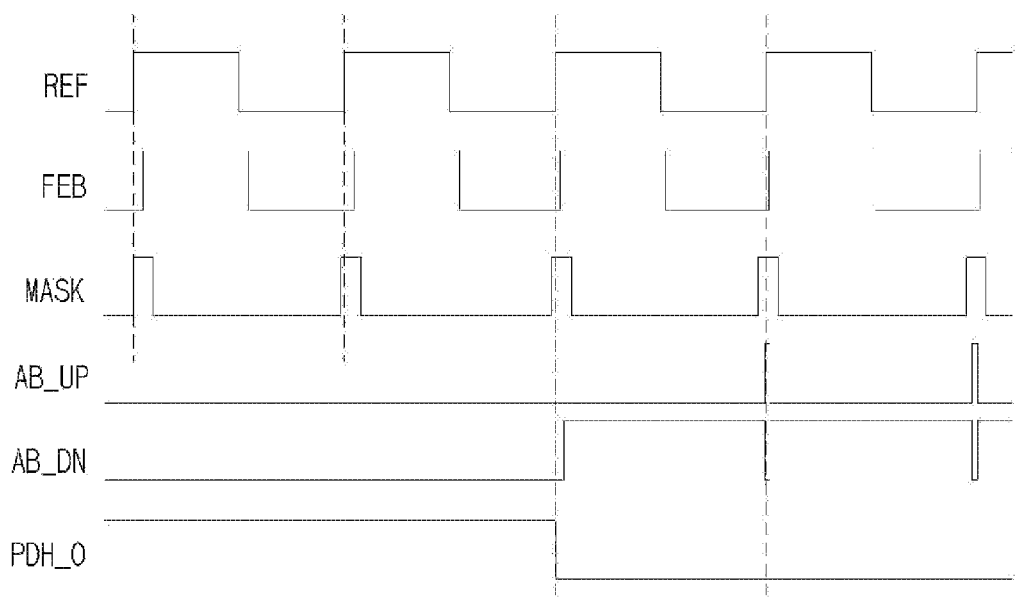
(a)
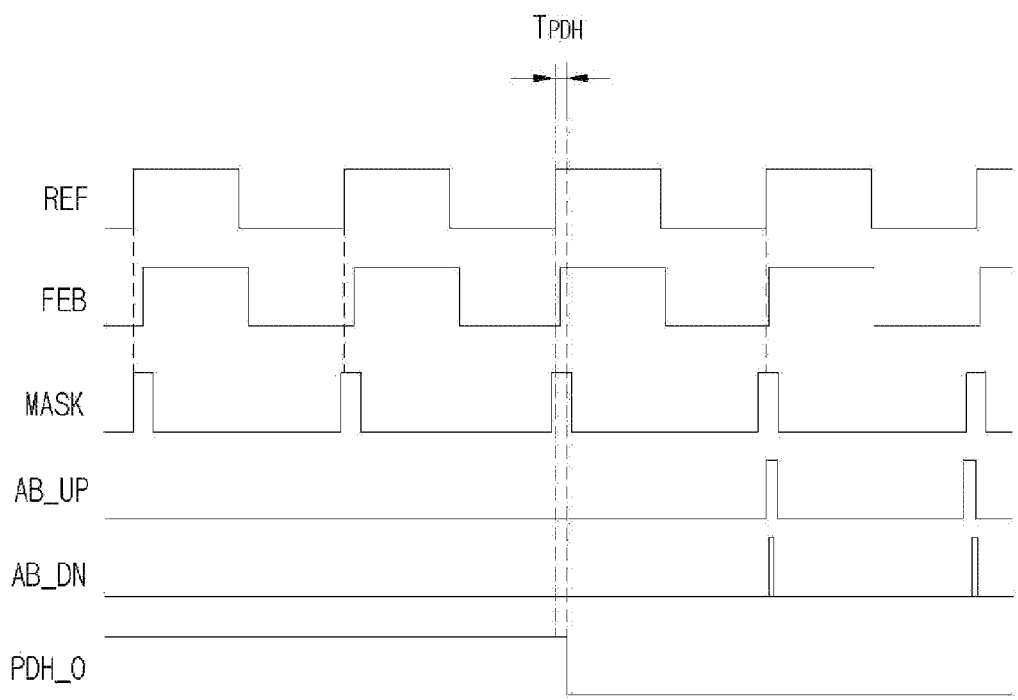
(b)

CIRCUIT FOR CONTROLLING VARIATION IN FREQUENCY OF CLOCK SIGNAL

BACKGROUND OF THE INVENTION

1. Field of the Invention

The present invention relates to a circuit for controlling a clock signal, and more particularly, to a circuit for controlling a variation in the frequency of a clock signal, which is capable of controlling an unwanted and abrupt variation in the frequency of a clock signal.

2. Description of the Related Art

In general, a clock signal is used for synchronization within a system or between systems, and various devices are designed to perform a process based on a clock signal.

When an abrupt variation in the frequency of a received clock signal is generated, the system does not perform an internal process or an error is generated in the system.

A system using a clock signal may be, for example, a Liquid Crystal Display (LCD). The timing controller of the LCD is one of representative devices for receiving an external clock signal and performing a process based on the clock signal.

A clock signal may include, for example, a clean clock signal and a Spread Spectrum Clock (hereinafter referred to as 'SSC') signal. A clean clock signal refers to a clock signal whose frequency remains constant, and an SSC signal refers to a clock signal whose frequency varies over time in order to reduce electromagnetic interference (EMI). A system using such a clean clock signal or an SSC signal may not perform a normal process when an unwanted and abrupt variation is generated in the frequency of a received clock signal.

FIG. 1(a) illustrates an abrupt variation in the frequency of a clean clock signal, and FIG. 1(b) illustrates an abrupt variation in the frequency of an SSC signal.

FIG. 1(a) shows a frequency variation over time when an unwanted and abrupt frequency variation, such as "A1", is generated in a clean clock signal used in a system due to an unspecified external or internal influence.

FIG. 1(b) shows a frequency variation over time when an unwanted and abrupt frequency variation, such as "A2", is generated in an SSC signal used in a system due to an unspecified external or internal influence.

The causes of unwanted and abrupt variations in the frequency, such as "A1" and "A2" of FIGS. 1(a) and 1(b), may include EMI due to an external circuit, power noise, ground noise, and noise within a chip.

In a system in which a clean clock signal or an SSC signal is synchronized with data or another clock signal, an abrupt variation in the frequency of the clean clock signal or the SSC signal may not maintain synchronization or may lead to a loss of data. Furthermore, a clean clock signal or an SSC signal having an abrupt frequency variation may deviate from a frequency range that can be received in a system.

Accordingly, if an abrupt variation in the frequency of a clock signal is generated in a conventional system, the system does not normally operate and requires a series of other processing (e.g., the restart of the system) for a normal operation.

In general, an abrupt variation in the frequency of a clean clock signal, such as that of FIG. 1(a), may be removed using a Phase Locked Loop (hereinafter referred to as 'PLL'). In this case, in order to block the abrupt variation in the frequency of the clean clock signal, the PLL needs to be designed to have a very small loop bandwidth. In order for the PLL to have a very small loop bandwidth, the capacitor of a loop filter needs to have high capacitance. An increase in the capacitance of the capacitor of the loop filter results in an increased chip size. Accordingly, efficiency is low if a PLL is designed to have a very small loop bandwidth in order to block an abrupt variation in the frequency of a clean clock signal.

Furthermore, it is difficult to control an abrupt variation in the frequency of an SSC signal, such as that of FIG. 1(b), by controlling the loop bandwidth of a PLL. The frequency of an SSC signal continues to vary over time. Accordingly, if the PLL is designed to have a very small loop bandwidth, a distributed spectrum characteristic is deteriorated. As a result, the PLL has a limited loop bandwidth attributable to the distributed spectrum characteristic. Accordingly, an abrupt variation in the frequency of the SSC signal cannot be removed by controlling only the loop bandwidth of the PLL.

Accordingly, there is a need for a technique capable of effectively blocking an abrupt variation in the frequency of a clock signal, such as a clean clock signal or an SSC signal used in a system.

SUMMARY OF THE INVENTION

Accordingly, the present invention has been made in an effort to solve the problems occurring in the related art, and an object of the present invention is to provide a circuit for controlling a variation in the frequency of a clock signal, which is capable of blocking an abrupt variation in the frequency of a clock signal, such as a clean clock signal or an SSC signal used in a system.

In order to achieve the above object, according to one aspect of the present invention, there is provided a circuit for controlling a variation in the frequency of a clock signal, including a phase detector for generating a phase difference signal between a reference clock signal and a feedback clock signal in response to a frequency control signal; an oscillation controller for generating a control voltage corresponding to the phase difference signal; a Voltage-Controlled Oscillator (VCO) for generating an oscillation signal having a frequency corresponding to the control voltage; a clock output circuit for generating the feedback clock signal using the oscillation signal and generating a mask signal including information about a phase of the feedback clock signal; and a frequency controller for generating the frequency control signal that is activated if a variation in the frequency of the reference clock signal is determined to be out of a set range in a state in which the phases of the reference clock signal and the feedback clock signal have been locked, maintaining the activation of the frequency control signal during a predetermined fixed time and a comparison time after the fixed time, and maintaining the comparison time up to a time at which the phase of the reference clock signal is determined to have approached the phase of the feedback clock signal based on the mask signal, wherein the phase difference detector regularly maintains the frequency of the feedback clock signal generated from the clock output circuit by controlling the phase difference signal while the frequency control signal is activated.

Furthermore, according to another aspect of the present invention, there is provided a circuit for controlling a variation in the frequency of a clock signal, including a Phase-Locked Loop (PLL) circuit for generating a phase difference signal by comparing the phases of a reference clock signal and a feedback clock signal with each other, generating the feedback clock signal corresponding to the phase difference signal, and regularly maintaining the frequency of the feedback clock signal when the frequency control signal that is activated is received; a mask signal generator for generating a mask signal including information about the phase of the feedback clock signal; and a frequency controller for determining whether or not the phases of the reference clock signal and the feedback clock signal have been locked by comparing the reference clock signal and the feedback clock signal with each other and providing the activated frequency control signal to the PLL circuit when the frequency of the reference clock signal is out of a predetermined range in the state in which the phases have been locked.

BRIEF DESCRIPTION OF THE DRAWINGS

The above objects, and other features and advantages of the present invention will become more apparent after a reading of the following detailed description taken in conjunction with the drawings, in which:

FIG. 1(a) is a waveform illustrating an abrupt variation in the frequency of a clean clock signal;

FIG. 1(b) is a waveform illustrating an abrupt variation in the frequency of an SSC signal;

FIG. 3(a) is a waveform illustrating a state in which an abrupt variation in the frequency of a clean clock signal has been blocked;

FIG. 3(b) is a waveform illustrating a state in which an abrupt variation in the frequency of an SSC signal has been blocked;

FIG. 11 is a timing diagram of a frequency variation detector when the frequency variation detector is not in a lock state;

FIGS. 12 and 13 are timing diagrams of the frequency variation detector in a lock state;

FIGS. 18(a) and 18(b) are timing diagrams of an up signal AB_UP and a down signal AB_DN in a normal state and an abnormal state depending on whether or not a delay time $T_{PDH}$ is applied.

DETAILED DESCRIPTION OF PREFERRED EMBODIMENTS

Figure 2:
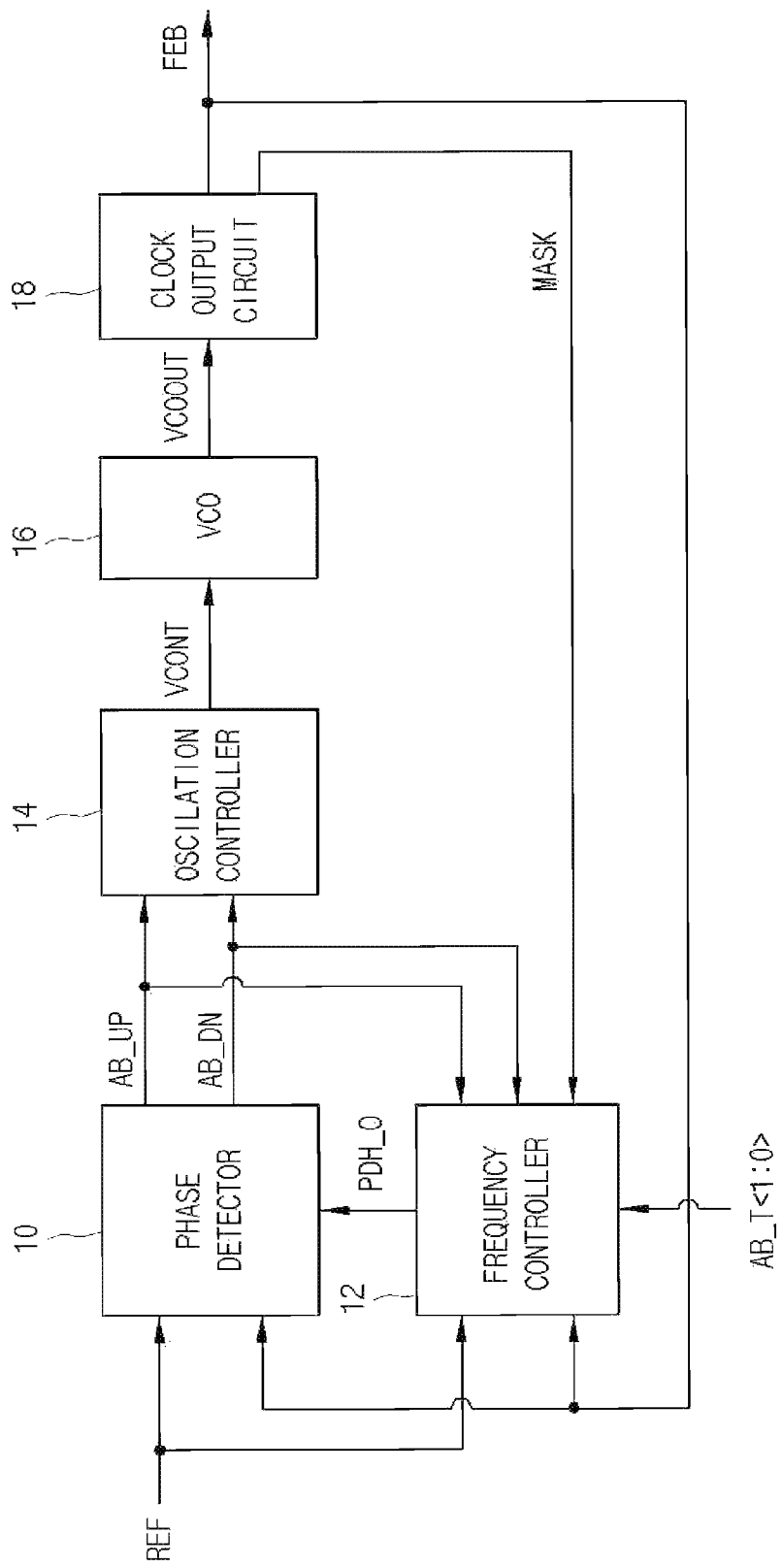
FIG. 2 is a block diagram showing an exemplary embodiment of a circuit for controlling a variation in the frequency of a clock signal in accordance with the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

Terms or words used hereinafter should not be construed as having common or dictionary meanings, but should be construed as having meanings and concepts that comply with the technical field of the present invention.

Accordingly, the following description and drawings illustrate embodiments of the present invention and do not limit the scope of the present invention. It would be understood by one of ordinary skill in the art that a variety of equivalents and modifications of the embodiments exist.

Embodiments of the present invention can be applied to the timing controller of an LCD.

More particularly, an embodiment of the present invention may be used in the input terminal of a timing controller and may be configured to control an abrupt variation in the frequency of an input clock signal.

A circuit for controlling a variation in the frequency of a clock signal in accordance with the present invention may include a PLL for blocking an abrupt variation in the frequency of a clock signal. An embodiment of the circuit may be implemented in the form of a block diagram as shown in FIG. 2.

The embodiment of FIG. 2 has a construction for stabilizing the frequency of a clean clock signal or an SSC signal as shown in FIG. 3(a) or 3(b) by blocking an abrupt variation in the frequency of the clean clock signal or the SSC signal as shown in FIG. 1(a) or 1(b).

The embodiment of FIG. 2 has a PLL structure as described above and may include a phase detector 10, a frequency controller 12, an oscillation controller 14, a Voltage-Controlled Oscillator (VCO) 16, and a clock output circuit 18.

The phase detector 10 is configured to receive a reference clock signal REF and a feedback clock signal FEB and output an up signal AB_UP and a down signal AB_DN. The up signal AB_UP and the down signal AB_DN are phase difference signals between the reference clock signal REF and the feedback clock signal FEB.

The phase detector 10 receives a frequency control signal PDH_O from the frequency controller 12. The phase detector 10 is set to output the up signal AB_UP and the down signal AB_DN according to a common PLL operation when the frequency control signal PDH_O of a logic level LOW is received and to fix the outputs of the up signal AB_UP and the down signal AB_DN to a logic level LOW when the frequency control signal PDH_O of a logic level HIGH is received.

The oscillation controller 14 is configured to receive the up signal AB_UP and the down signal AB_DN from the phase detector 10 and to output a control voltage VCONT.

The VCO 16 is configured to receive the control voltage VCONT and to output an oscillation signal VCOOUT.

The clock output circuit 18 is configured to receive the oscillation signal VCOOUT and to output the feedback clock signal FEB and a mask signal MASK.

Furthermore, the frequency controller 12 receives the reference clock signal REF, the feedback clock signal FEB, the up signal AB_UP, the down signal AB_DN, the mask signal MASK, and input signal AB_T<0:1>, generates the frequency control signal PDH_O of a logic level HIGH or a logic level LOW depending on whether or not an abrupt variation is generated in the frequency of the reference clock signal REF, and supplies the frequency control signal PDH_O to the phase detector 10.

The circuit in accordance with the embodiment of FIG. 2 receives the reference clock signal REF and outputs the feedback clock signal FEB having the same frequency as the reference clock REF, when a normal operation is performed. That is, the circuit in accordance with the embodiment of FIG. 2 performs a PLL operation.

If the reference clock signal REF is an SSC signal, the loop bandwidth of the circuit in accordance with the embodiment of FIG. 2 may be set to a value that well complies with the modulation frequency and modulation ratio of the SSC signal when a normal operation is performed.

A state in which the frequency and phase of the reference clock signal REF are matched with those of the feedback clock signal FEB is called a lock state.

In the lock state, when the frequency of the reference clock signal REF abruptly varies, the frequency controller 12 detects an abrupt variation in the frequency of the reference clock signal REF, the phase detector 10 maintains the up signal AB_UP and the down signal AB_DN in a logic level LOW, and the control voltage VCONT generated from the oscillation controller 14 is fixed.

In accordance with the aforementioned operation, the circuit in accordance with the embodiment of FIG. 2 operates in such a way as to maintain the frequency of the feedback clock signal FEB in the same state as that before an abrupt frequency variation occurs so that an abrupt variation in the frequency of the feedback clock signal FEB is blocked.

Figure 4:
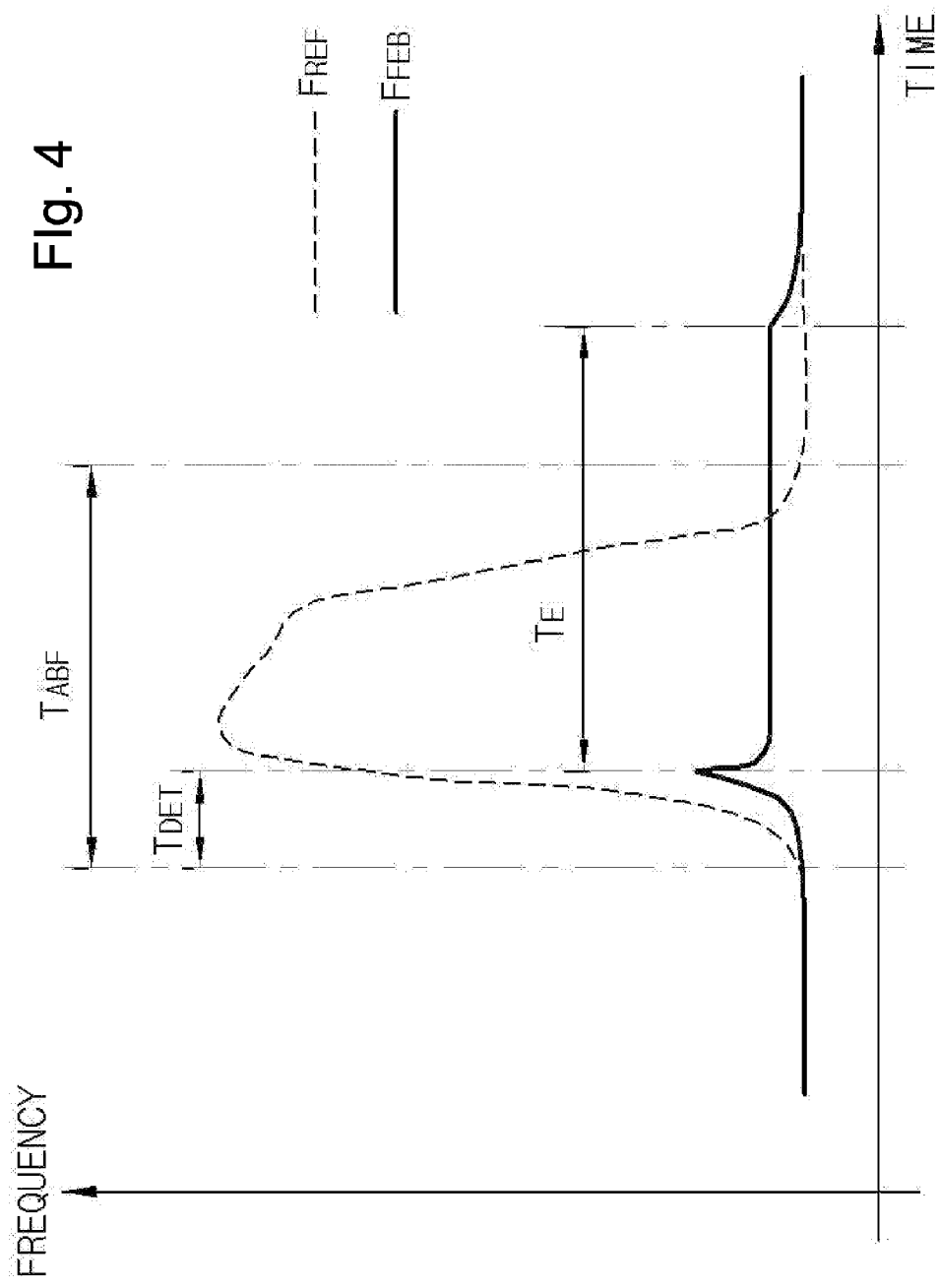
FIG. 4 is a waveform illustrating a state in which a feedback clock signal is controlled in accordance with an embodiment of the present invention.

FIG. 4 shows a frequency variation waveform $F_{REF}$ of the reference clock signal REF and a frequency variation waveform $F_{FEB}$ in which an abrupt frequency variation has been blocked in accordance with an embodiment of the present invention, over time when an abrupt frequency variation is generated.

As shown in FIG. 4, when the frequency of the reference clock signal REF abruptly varies for an abrupt frequency variation time $T_{ABF}$, the frequency controller 12 in accordance with an embodiment of the present invention detects such an abrupt frequency variation after a time $T_{DET}$. In response thereto, the frequency controller 12 in accordance with an embodiment of the present invention fixes the frequency of the feedback clock signal FEB for a time $T_E$ in order to block an abrupt variation in the frequency of the feedback clock signal FEB.

Figure 5:
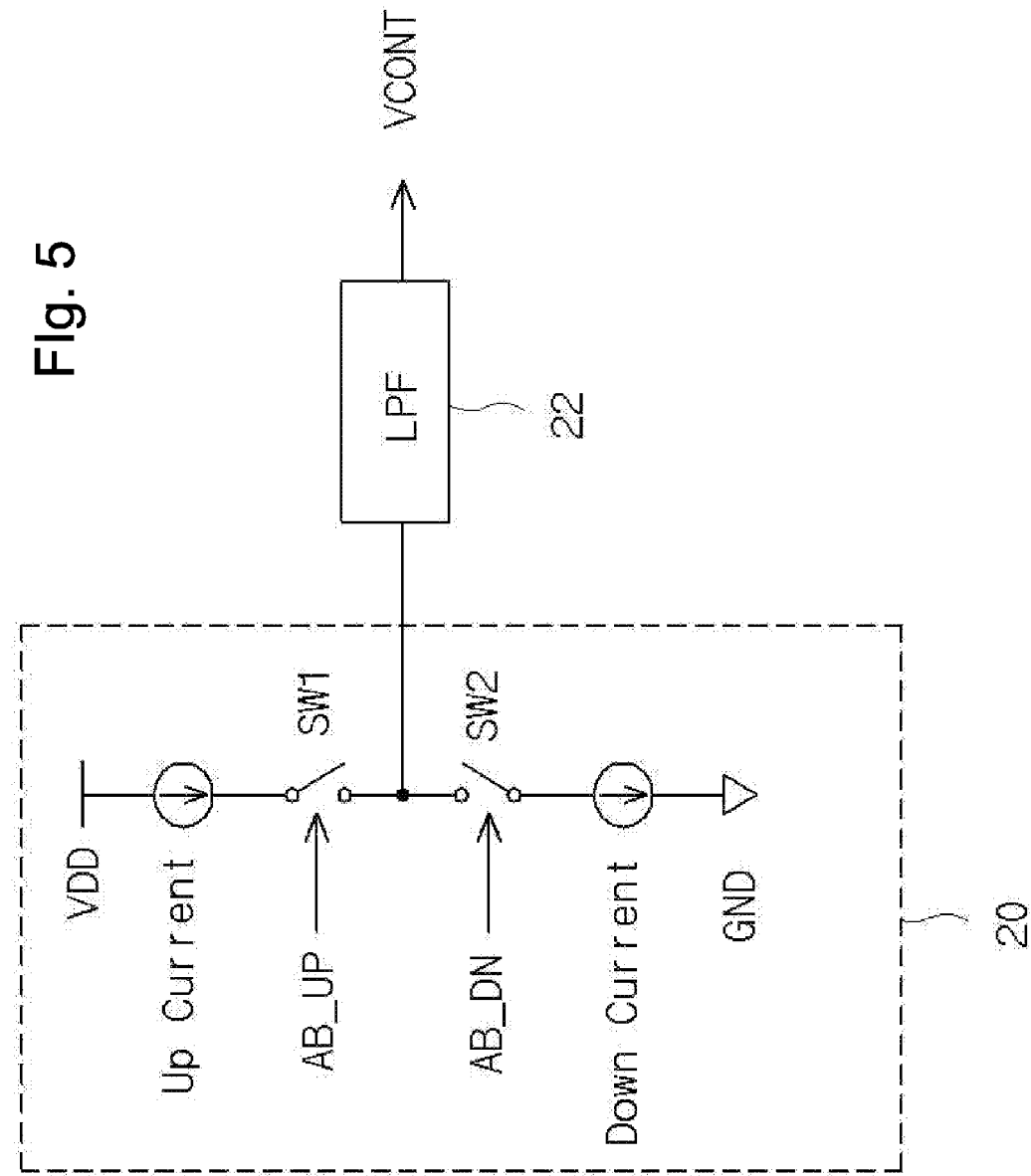
FIG. 5 is a detailed block diagram showing an oscillation controller of FIG. 2.

In the aforementioned structure, a detailed construction of the oscillation controller 14 is described with reference to FIG. 5. FIG. 5 is a block diagram showing of the oscillation controller 14.

The oscillation controller 14 may include a charge pump 20 and a Low-Pass Filter (hereinafter referred to as 'LPF') 22.

The switch SW1 of the charge pump 20 is turned on when the up signal AB_UP generated from the phase detector 10 has a logic level HIGH, and thus the charge pump 20 supplies a current according to a constant voltage VDD (i.e., an up current) to the LPF 22. When the current according to the constant voltage VDD (i.e., up current) is generated from the charge pump 20, the control voltage VCONT generated from the LPF 22 rises.

Furthermore, when the down signal AB_DN generated from the phase detector 10 has a logic level HIGH, the switch SW2 of the charge pump 20 is turned on, and thus the charge pump 20 supplies a current according to the ground GND (i.e., down current) to the LPF 22. To supply the current according to the ground GND (i.e., down current) to the LPF 22 means that a current flows through the ground GND. Accordingly, when the charge pump 20 provides a path along which the current according to the ground GND (i.e., down current) flows, the control voltage VCONT generated from the LPF 22 falls.

If the up signal AB_UP and the down signal AB_DN have a logic level HIGH at the same time, a current does not flow from the charge pump 20 to the LPF 22 and does not branch to the ground GND. Accordingly, the control voltage VCONT generated from the LPF 20 remains constant.

Furthermore, if the up signal AB_UP and the down signal AB_DN have a logic level LOW at the same time, input side of the LPF 22 floated, that is, becomes a Hi-impedance (Hi-Z) state. Accordingly, the control voltage VCONT generated from the LPF 20 remains constant.

In accordance with an embodiment of the present invention, if the frequency control signal PDH_O, that is, the output of the frequency controller 12, has a logic level HIGH, both the up signal AB_UP and the down signal AB_DN, that is, the output of the phase detector 10, have a logic level LOW. As a result, the control voltage VCONT remains constant.

The VCO 16 generates the oscillation signal VCOOUT having a frequency that corresponds to a level of the control voltage VCONT.

Figure 6:
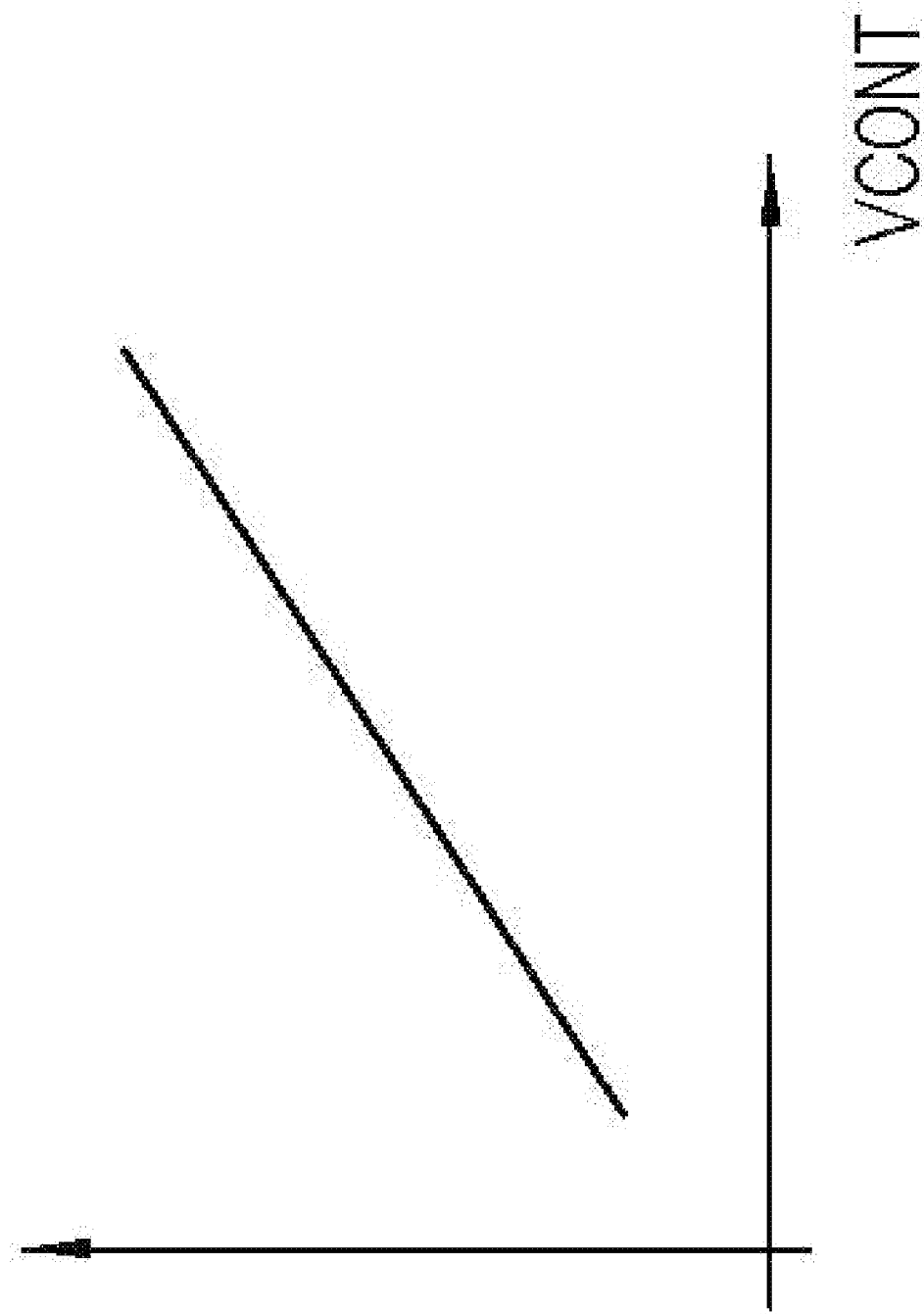
FIG. 6 is a graph showing a variation in the frequency of an oscillation signal according to a control voltage.

That is, the VCO 16 operates in such a way as to have a correlation, such as that of FIG. 6. As shown in FIG. 6, when the control voltage VCONT remains constant, the VCO 16 generates the oscillation signal VCOOUT having a constant frequency.

Figure 7:
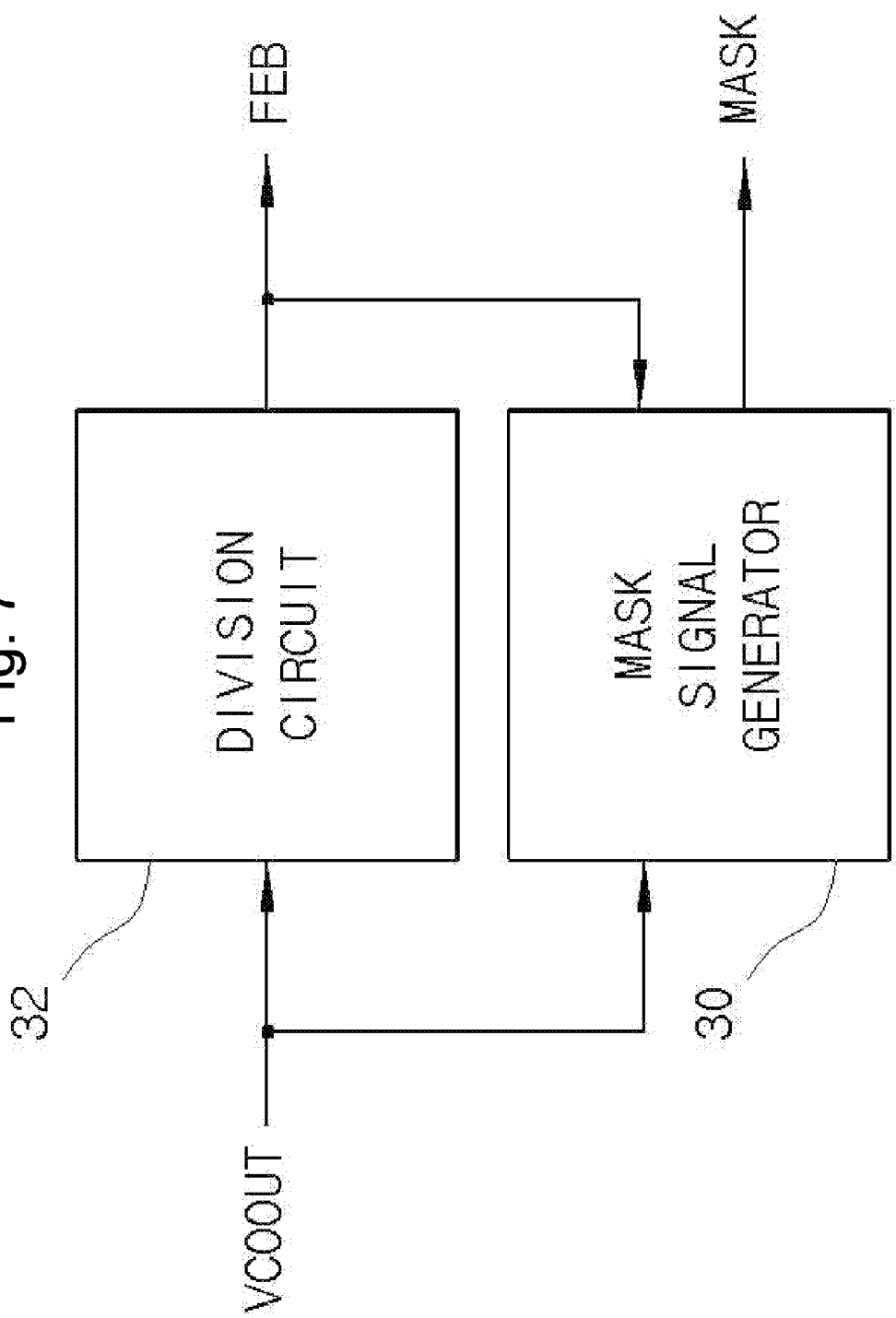
FIG. 7 is a detailed block diagram showing a clock output circuit of FIG. 2.

A detailed construction of the clock output circuit 18 is described below with reference to FIG. 7. FIG. 7 is a block diagram of the clock output circuit 18. The clock output circuit 18 includes a mask signal generator 30 and a division circuit 32.

Figure 8:
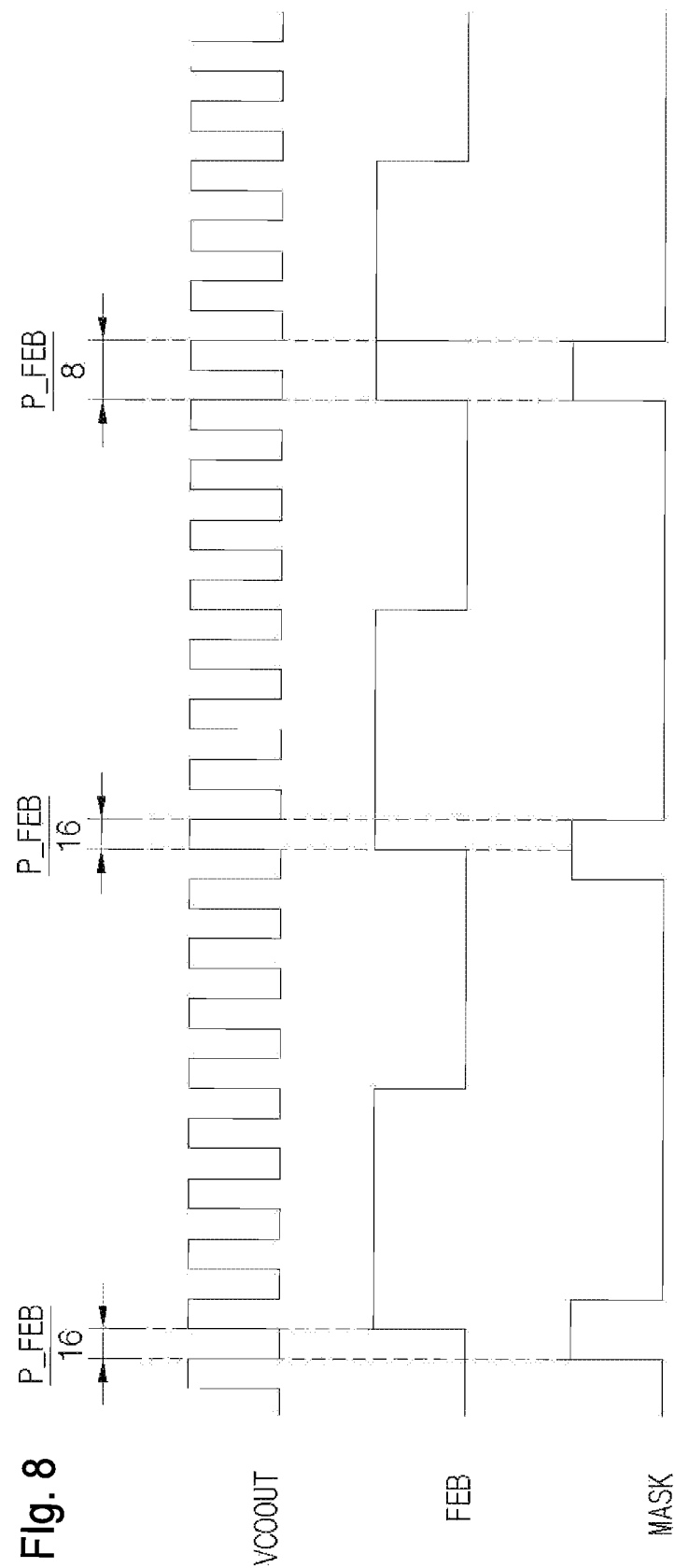
FIG. 8 is a timing diagram of a clock output circuit of FIG. 7.

FIG. 8 is a timing diagram of the clock output circuit 18 of FIG. 7.

The mask signal generator 30 and the division circuit 32 receive the oscillation signal VCOOUT.

The division circuit 32 has been illustrated as including an 8-division circuit. The division circuit 32 divides the oscillation signal VCOOUT by 8 and outputs the division results as the feedback clock signal FEB.

The mask signal generator 30 can generate the mask signal MASK having a phase difference equal to "±P_FEB/16" from a rising edge of the feedback clock signal FEB using the oscillation signal VCOOUT and the feedback clock signal FEB. That is, the mask signal MASK includes information about the phase of the feedback clock signal FEB. Here, P_FEB indicates the cycle of the feedback clock signal FEB.

The mask signal generator 30 has been illustrated as generating the mask signal MASK having a phase difference equal to "±P_FEB/16" from a rising edge of the feedback clock signal FEB, but the present invention is not limited thereto. The construction of the mask signal generator 30 may be changed in various ways depending on an intention of a manufacturer.

The mask signal MASK having a phase difference equal to "±P_FEB/16" from a rising edge of the feedback clock signal FEB may have a pulse width corresponding to one cycle of the oscillation signal VCOOUT. Furthermore, the mask signal MASK may be changed to have a phase difference equal to "±P_FEB/n (wherein n is a natural number)" from a rising edge of the feedback clock signal FEB. The mask signal generator 30 can determine a phase difference for generating the mask signal MASK using the oscillation signal VCOOUT. That is, a phase difference equal to "±P_FEB/16" from a rising edge of the feedback clock signal FEB may be determined to be an interval between a falling edge of the oscillation signal VCOOUT that is advanced by half cycle and a falling edge of the oscillation signal VCOOUT that is delayed by half cycle on the basis of a rising edge of the feedback clock signal FEB.

The mask signal MASK is generated in order to set a time at which a normal operation is started, after an interval in which an abrupt frequency variation has been generated is blocked.

When entering a normal operation after blocking an interval in which an abrupt frequency variation has been generated, a phase difference may be present between the reference clock signal REF and the feedback clock signal FEB. When a normal operation is started within a range of the pulse width of the mask signal MASK, a glitch component attributable to a phase difference between the reference clock signal REF and the feedback clock signal FEB can be reduced, and a lock can be immediately performed.

Figure 9:
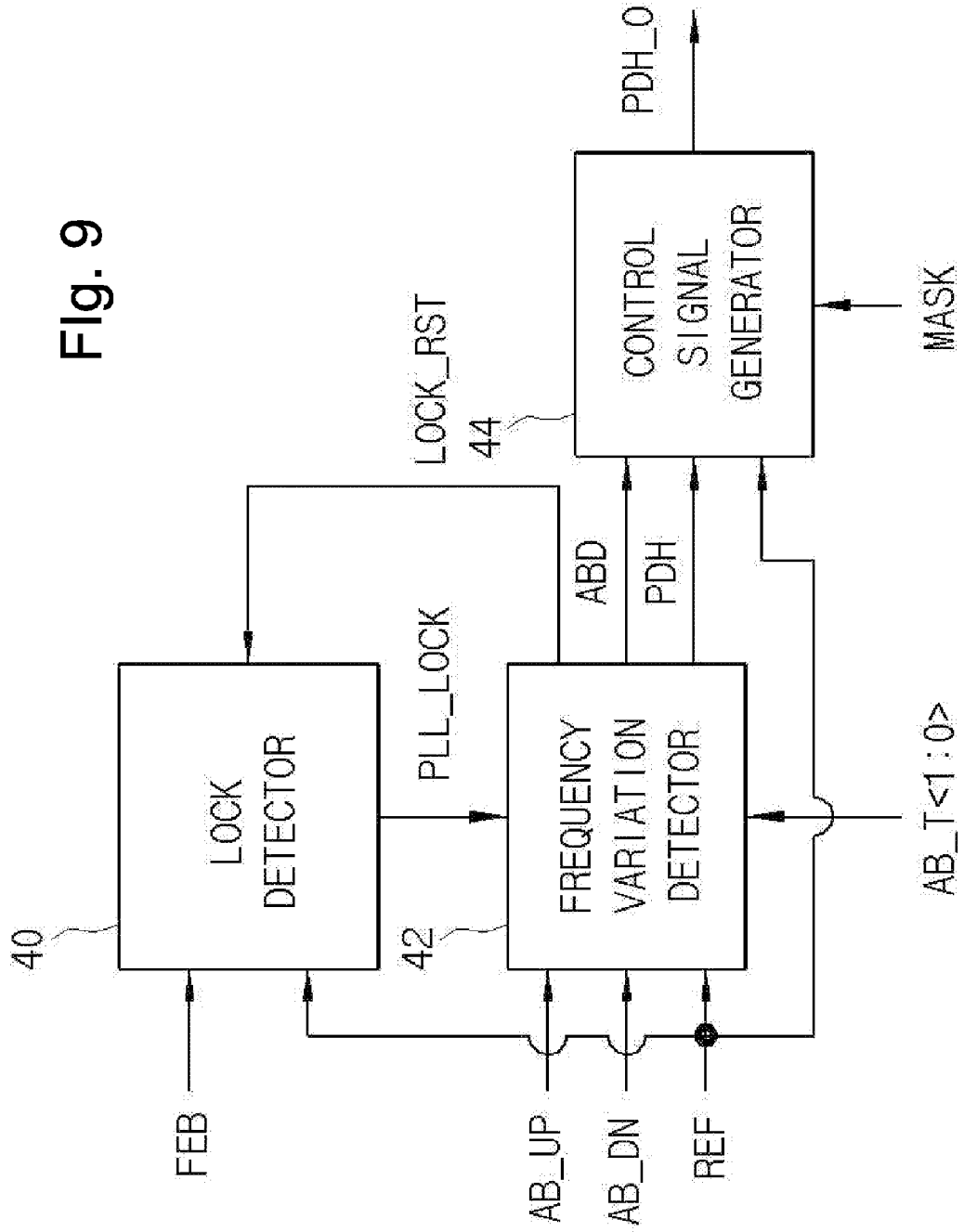
FIG. 9 is a detailed block diagram of a frequency controller of FIG. 2.

Meanwhile, the frequency controller 12 may be implemented in the form of a block diagram shown in FIG. 9.

Referring to FIG. 9, the frequency controller 12 includes a lock detector 40, a frequency variation detector 42, and a control signal generator 44.

When the state of the PLL is not a lock state or the reference clock signal REF does not have an abrupt frequency variation, the frequency controller 12 of FIG. 9 performs the same operation as that of a common PLL.

The frequency controller 12 in accordance with the present invention controls the output of the phase detector 10 when the frequency of the reference clock signal REF abruptly varies in a lock state.

The lock detector 40 determines whether or not the PLL is in a lock state by comparing the reference clock signal REF and the feedback clock signal FEB with each other and outputs a lock detection signal PLL_LOCK based on a result of the determination. If the PLL is determined to be in a lock state as a result of a comparison between the reference clock signal REF and the feedback clock signal FEB, the lock detector 40 outputs the lock detection signal PLL_LOCK of a logic level HIGH.

The frequency variation detector 42 determines a lock state using the lock detection signal PLL_LOCK and controls to enter into a normal operation if an abrupt variation is generated in the frequency of the reference clock signal REF in the lock state.

That is, if an abrupt variation is generated in the frequency of the reference clock signal REF after the lock detection signal PLL_LOCK becomes a logic level HIGH, the frequency controller 12 of FIG. 9 controls to generate the feedback clock signal FEB having an abrupt frequency variation.

If the frequency of the reference clock signal REF abruptly varies in a state other than a lock state, the frequency controller 12 performs the same operation as that of a common PLL.

Figure 10:
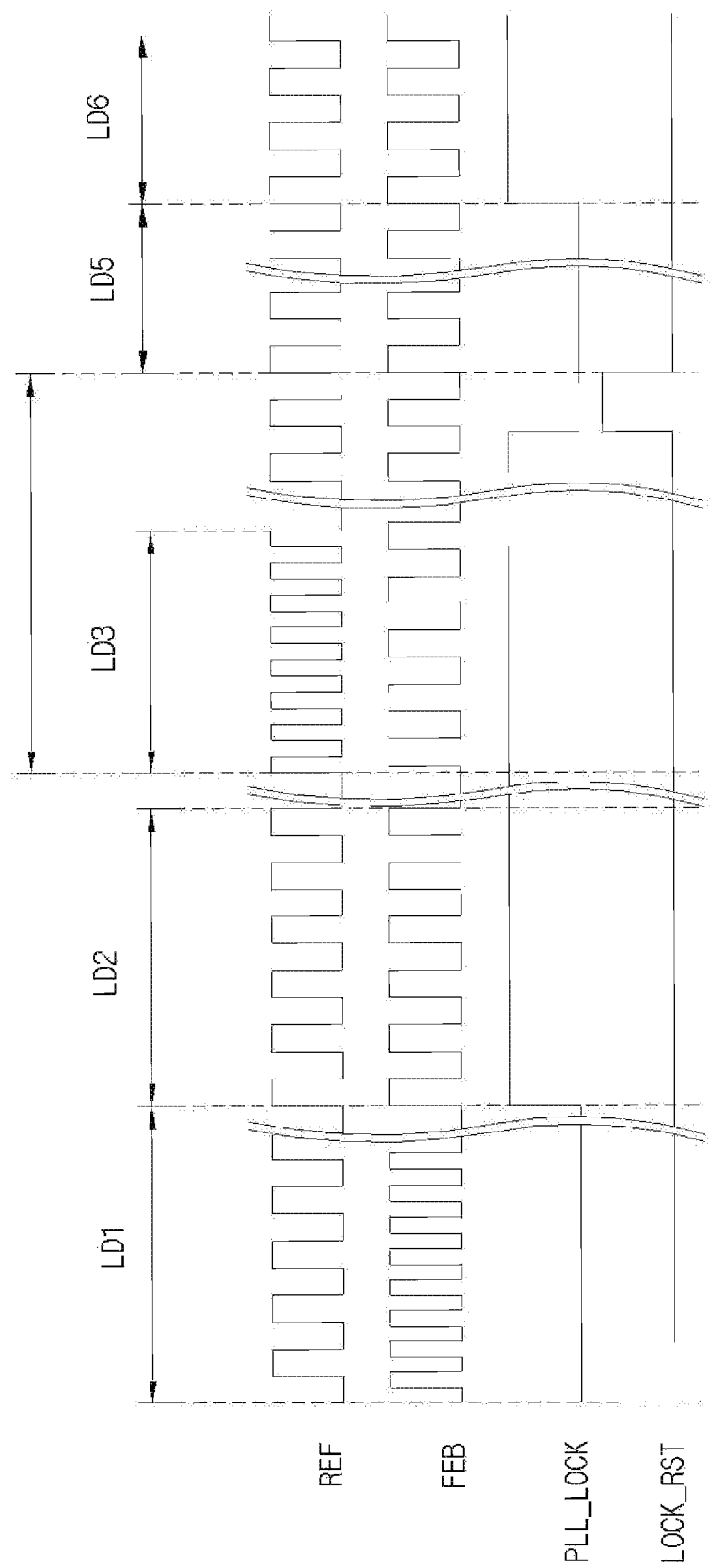
FIG. 10 is a timing diagram of a lock detector.

FIG. 10 shows a timing diagram according to an operation of the lock detector 40.

In FIG. 10, an interval LD1 is an interval before the circuit in accordance with an embodiment of the present invention becomes a lock state. In the interval LD1, the circuit in accordance with an embodiment of the present invention performs a common PLL operation.

The circuit in accordance with an embodiment of the present invention performs a PLL operation in the state in which a lock has not been executed as in the interval LD1 and performs a control operation for changing the state of the circuit into a lock state in which the reference clock signal REF and the feedback clock signal FEB have the same frequency and phase through a PLL operation. An interval LD2 is a lock state interval.

When entering the interval LD2, the lock detector 40 outputs the lock detection signal PLL_LOCK of a logic level HIGH.

After the lock detection signal PLL_LOCK shifts to a logic level HIGH, although the frequency of the reference clock signal REF abruptly varies and thus the reference clock signal REF and the feedback clock signal FEB do not have the same frequency and phase, the lock detector 40 maintains the lock detection signal PLL_LOCK in a logic level HIGH until it is reset in response to a lock reset signal LOCK_RST signal.

In accordance with an embodiment of the present invention, after an abrupt frequency variation in the reference clock signal REF is blocked, when the lock detector 40 is reset in response to the lock reset signal LOCK_RST generated from the frequency variation detector 42, the lock detection signal PLL_LOCK shifts to a logic level LOW.

Thereafter, the lock detector 40 compares the frequencies and phases of the reference clock signal REF and the feedback clock signal FEB with each other. If, as a result of the comparison, the reference clock signal REF and the feedback clock signal FEB have the same frequency of and phase (i.e., a lock state), the lock detector 40 outputs the lock detection signal PLL_LOCK of a logic level HIGH.

In order for the lock detector 40 to maintain the lock detection signal PLL_LOCK in a logic level HIGH, the state in which the reference clock signal REF and the feedback clock signal FEB have the same frequency and phase needs to continue for a specific time.

In FIG. 10, an interval LD3 is an interval in which an abrupt variation is generated in the frequency of the reference clock signal REF. Furthermore, an interval LD4 is an interval in which an abrupt variation occurred in the frequency of the reference clock signal REF is detected and an abrupt variation in the frequency of the feedback clock signal FEB is blocked. Furthermore, an interval LD5 is an interval in which a PLL lock is prepared after the interval LD4 elapses and is an interval in which whether or not the reference clock signal REF and the feedback clock signal FEB maintaining the same frequency and phase for a specific time monitors. Furthermore, an interval LD6 is an interval in which a lock state in which the reference clock signal REF and the feedback clock signal FEB have the same frequency and phase is maintained.

As described above, if the circuit in accordance with an embodiment of the present invention is not in a lock state (i.e., the interval LD1 of FIG. 10), the frequency variation detector 42 can operate as in a timing diagram of FIG. 11.

FIG. 11(a) shows an example in which the feedback clock signal FEB has a higher frequency than the reference clock signal REF in the state in which a PLL lock has not been performed.

In this case, a pulse width of the down signal AB_DN is determined to be a width in which the feedback clock signal FEB has a higher frequency than the reference clock signal REF.

FIG. 11(b) shows an example in which the feedback clock signal FEB has a lower frequency than the reference clock signal REF in the state in which a PLL lock has not been performed.

In this case, a pulse width of the down signal AB_UP is determined to be a width in which the feedback clock signal FEB has a lower frequency than the reference clock signal REF.

When the circuit is not in a lock state as in FIG. 11, the lock detector 40 outputs the lock detection signal PLL_LOCK of a logic level LOW (L). When the lock detection signal PLL_LOCK is in a logic level LOW, the frequency variation detector 42 outputs a frequency variation detection signal ABD and a holding signal PDH of a logic level LOW (L).

In accordance with an embodiment of the present invention, when the circuit is not in a lock state as in the interval LD1 of FIG. 10 as shown in FIG. 11, the frequency of the feedback clock signal FEB can be controlled in response to the up signal AB_UP and the down signal DN generated from the phase detector 10, so a lock can be performed. When a lock is performed, the operation of the circuit in accordance with an embodiment of the present invention is changed from the interval LD1 to the interval LD2.

When detecting an abrupt variation in the frequency of the reference clock signal REF in the lock state, the frequency variation detector 42 can operate as in a timing diagram of FIG. 12.

The frequency variation detector 42 can detect an abrupt variation in the frequency of the reference clock signal REF by detecting a shift in the phase of the reference clock signal REF.

FIG. 12(a) is a timing diagram of the frequency variation detector 42 when the frequency of the reference clock signal REF very abruptly varies in a lock state.

Furthermore, FIG. 12(b) is a timing diagram of the frequency variation detector 42 when the frequency of the reference clock signal REF very slowly varies in a lock state.

The frequency variation detector 42 recognizes that an abrupt frequency variation has occurred if a falling edge of the reference clock signal REF is present in an interval in which the up signal AB_UP or the down signal AB_DN signal is in a logic level HIGH.

If a falling edge of the reference clock signal REF is present in the interval in which the up signal AB_UP or the down signal AB_DN signal is in a logic level HIGH, the frequency variation detector 42 outputs the frequency variation detection signal ABD signal and the holding signal PDH of a logic level HIGH.

If a falling edge of the reference clock signal REF is present in the interval in which the up signal AB_UP or the down signal AB_DN signal is in a logic level HIGH, the frequency variation detector 42 recognizes that an abrupt frequency variation has occurred. Accordingly, a detection time $T_{DET}$ is necessary until the frequency variation detector 42 outputs the frequency variation detection signal ABD and the holding signal PDH of a logic level HIGH.

Figure 13:
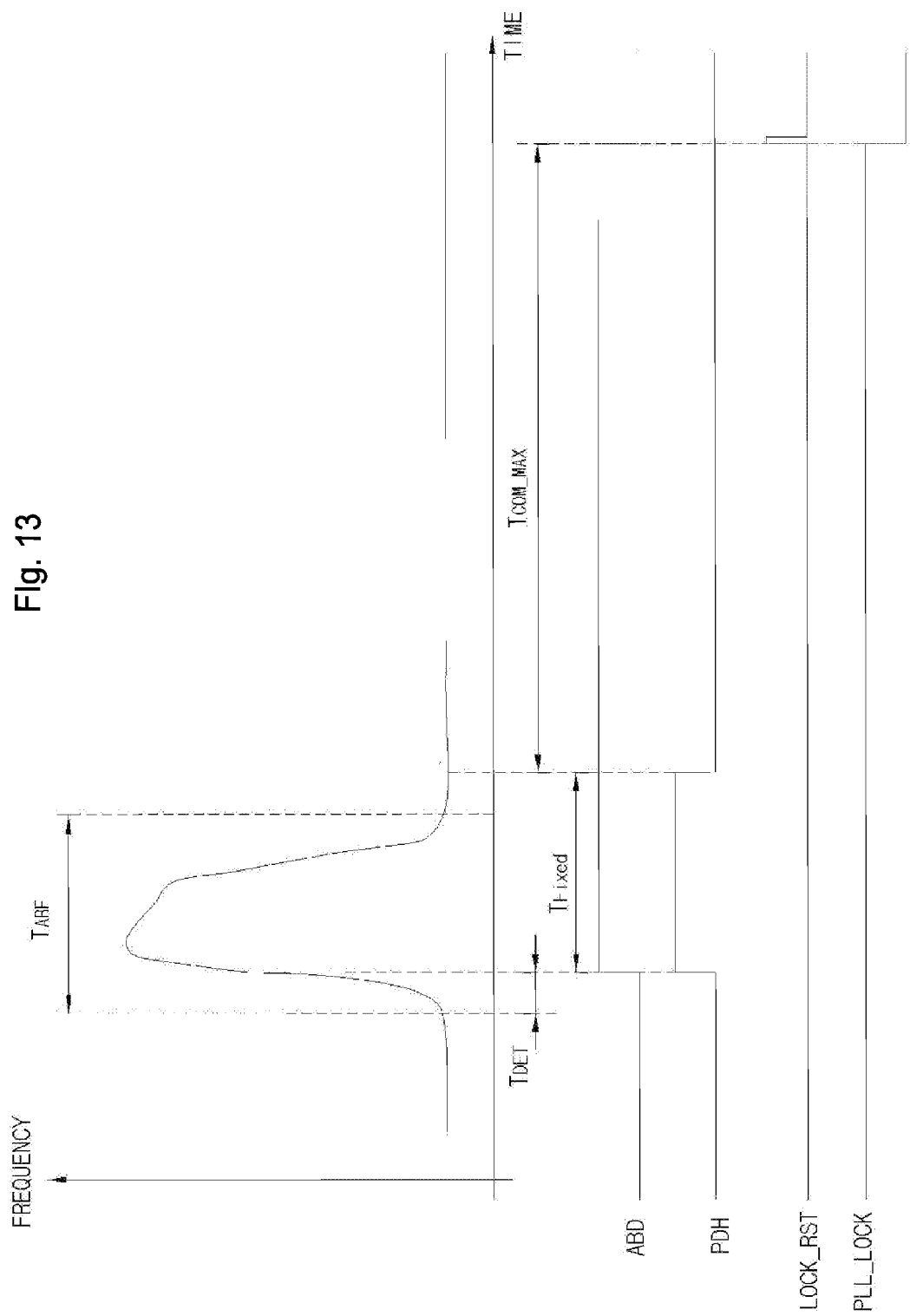

When an abrupt variation is generated in the frequency of the reference clock signal REF, the frequency variation detector 42 operates as in a timing diagram of FIG. 13.

FIG. 13 is a timing diagram of the frequency variation detector 42 in the case where an abrupt variation in the frequency of the reference clock signal REF is represented as a frequency variation over time.

When an abrupt variation occurs in the frequency of the reference clock signal REF as shown in FIG. 13, the frequency variation detector 42 outputs the frequency variation detection signal ABD and the holding signal PDH of a logic level HIGH after the detection time $T_{DET}$.

The frequency variation detector 42 continues to maintain the holding signal PDH in a logic level HIGH for a predetermined and fixed time $T_{Fixed}$ and then shifts maintain the holding signal PDH to a logic level LOW.

When an abrupt variation occurs in the frequency of the frequency variation detection signal ABD, the frequency variation detection signal ABD shifts to a logic level HIGH after the detection time $T_{DET}$, continues to maintain a logic level HIGH for the fixed time $T_{Fixed}$ and a maximum comparison time $T_{Comp\_MAX}$, and then shifts to a logic level LOW.

Furthermore, after an abrupt variation occurs in the frequency of the reference clock signal REF, the lock reset signal LOCK_RST continues to maintain a logic level LOW for the detection time $T_{DET}$, the fixed time $T_{Fixed}$, and the maximum comparison time $T_{Comp\_MAX}$. Thereafter, the lock reset signal LOCK_RST maintains a logic level (HIGH) interval having a pulse width that corresponds to one cycle or less of the reference clock signal REF and then shifts to a logic level LOW.

The lock detector 40 is reset in response to the lock reset signal LOCK_RST, and thus the lock detector 40 outputs the lock detection signal PLL_LOCK of a logic level LOW again.

The fixed time $T_{Fixed}$ and the maximum comparison time $T_{Comp\_MAX}$ of FIG. 13 can be determined by the input signal AB_T<1:0> of the frequency variation detector 42.

The input signal AB_T<1:0> may be designed to have a 2-bit value, such as '00', '01', '10', or '11'. The input signal AB_T<1:0> may be set to change the fixed time $T_{Fixed}$ and the maximum comparison time $T_{Comp\_MAX}$ in various ways depending on the amount and time of an abrupt frequency variation.

For example, if the input signal AB_T<1:0> of '00' is received, the fixed time $T_{Fixed}$ may be set to 32 clocks on the basis of the reference clock signal REF, and the maximum comparison time $T_{Comp\_MAX}$ may be set to 224 clocks on the basis of the reference clock signal REF. Furthermore, if the input signal AB_T<1:0> of '11' is received, the fixed time $T_{Fixed}$ may be set to 64 clocks on the basis of the reference clock signal REF, and the maximum comparison time $T_{Comp\_MAX}$ may be set to 192 clocks on the basis of the reference clock signal REF.

Both the fixed time $T_{Fixed}$ and the maximum comparison time $T_{Comp\_MAX}$ may be represented based on the cycle of the reference clock signal REF.

Here, the fixed time $T_{Fixed}$ may be set in various ways, but the fixed time $T_{Fixed}$ may be set such that the sum of the fixed time $T_{Fixed}$ and the detection time $T_{DET}$ becomes the abrupt frequency variation time $T_{ABF}$ or higher.

Meanwhile, the control signal generator 44 receives the frequency variation detection signal ABD and the holding signal PDH from the frequency variation detector 42. Furthermore, the control signal generator 44 receives the reference clock signal REF and the mask signal MASK. Furthermore, the control signal generator 44 generates the frequency control signal PDH_O using the received signals and outputs the frequency control signal PDH_O.

Figure 14:
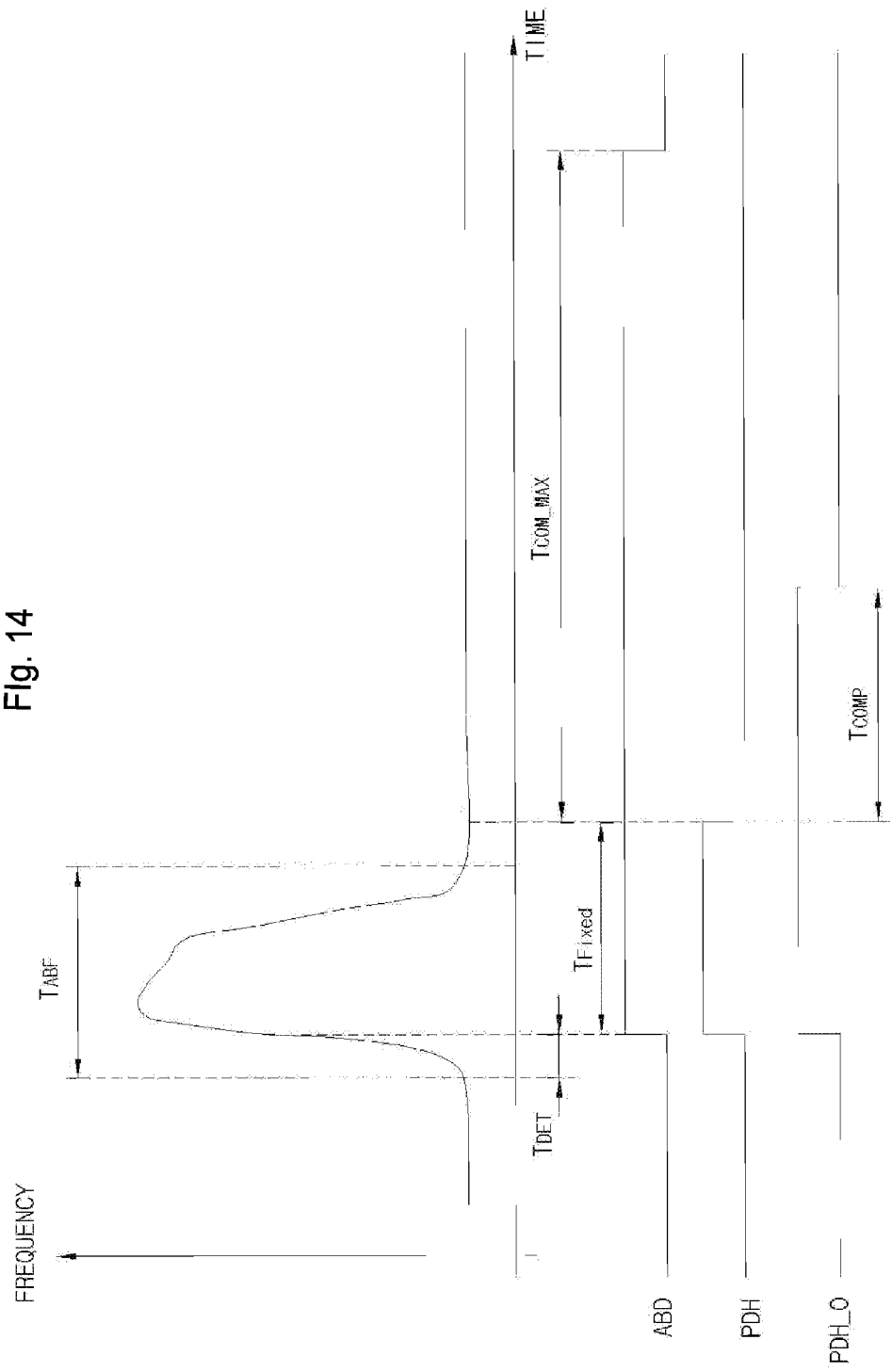
FIG. 14 is a timing diagram of a control signal generator.

A timing diagram according to an operation of the control signal generator 44 is shown in FIG. 14. Furthermore, FIG. 14 is a timing diagram when the frequency control signal PDH_O of a logic level LOW is outputted, and an example in which the control signal generator 44 outputs the frequency control signal PDH_O of a logic level LOW is described with reference to FIG. 15.

If a rising edge of the reference clock signal REF is present in an interval in which the frequency variation detection signal ABD is in a logic level HIGH and simultaneously the holding signal PDH is in a logic level LOW, the control signal generator 44 outputs the frequency control signal PDH_O of a logic level LOW after a time $T_{PDH}$ during which the holding signal PDH maintains a logic level HIGH from a rising edge of the reference clock signal REF.

The interval in which the frequency variation detection signal ABD is in a logic level HIGH and simultaneously the holding signal PDH is in a logic level LOW corresponds to the maximum comparison time $T_{Comp\_MAX}$.

Here, a comparison time $T_{Comp}$ is the time taken for a comparison until a rising edge of the reference clock signal REF is present in an interval in which the mask signal MASK is in a logic level HIGH.

Figure 15:
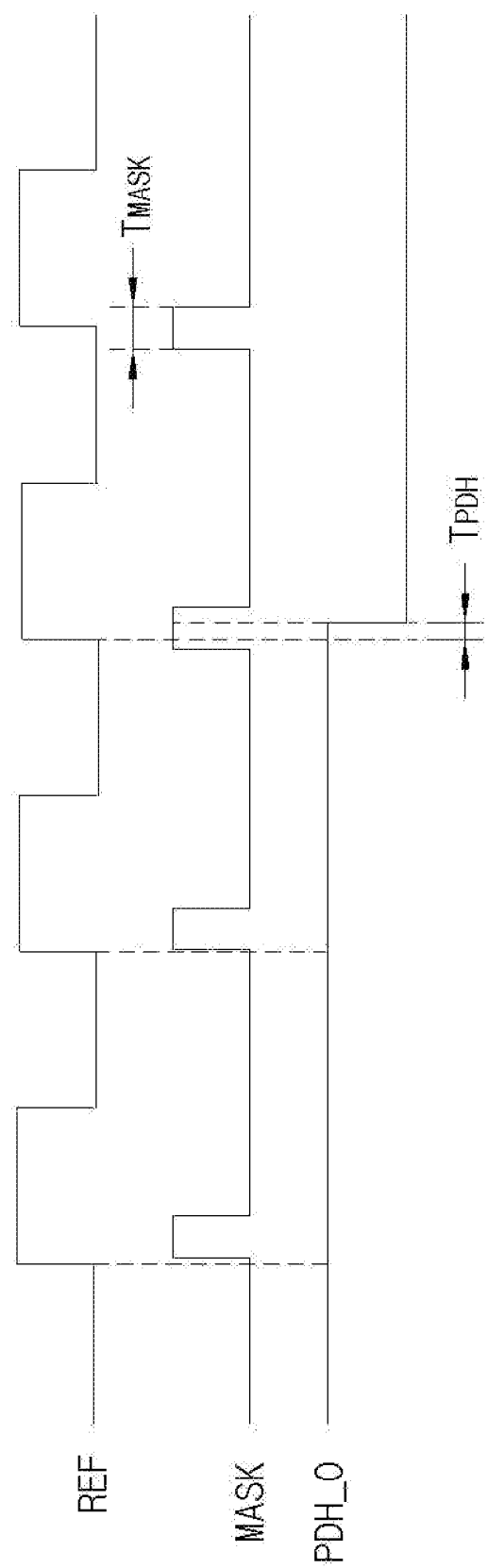
FIG. 15 is a timing diagram illustrating that the control signal generator generates a frequency control signal of a logic level LOW.

If a rising edge of the reference clock signal REF is present in the interval in which the mask signal MASK is in a logic level HIGH as shown in FIG. 15, the frequency control signal PDH_O shifts to a logic level LOW after the time $T_{PDH}$ during which the holding signal PDH maintains a logic level HIGH from the rising edge of the reference clock signal REF.

Here, the time $T_{PDH}$ during which the holding signal PDH maintains a logic level HIGH may be designed to be smaller than $T_{MASK}/2$.

$T_{MASK}$ indicates the time during which the mask signal MASK maintains a logic level HIGH.

In accordance with an embodiment of the present invention, the time "P_FEB/8" of FIG. 8 may be used as the time during which the mask signal MASK generated from the clock output circuit 18 maintains a logic level HIGH.

Although an abrupt variation is generated in the frequency of the reference clock signal REF during the time $T_{ABF}$ as shown in FIG. 14, an abrupt variation is not generated in the frequency of the feedback clock signal FEB. Accordingly, the feedback clock signal FEB after the frequency control signal PDH_O of FIG. 15 shifts to a logic level LOW maintains a frequency similar to that of the reference clock signal REF before the abrupt frequency variation.

During the comparison time $T_{Comp}$, the reference clock signal REF and the feedback clock signal FEB have a very similar frequency level. Accordingly, if a rising edge of the reference clock signal REF is present in an interval in which the mask signal MASK is in a logic level HIGH, a rising edge of the reference clock signal REF is also present in an interval in which the mask signal MASK is in a logic level HIGH.

Meanwhile, the structure and operation of the phase detector 10 are described with reference to FIG. 16.

The phase detector 10 includes a phase frequency detector 50 and two multiplexers 52 and 54.

Figure 16:
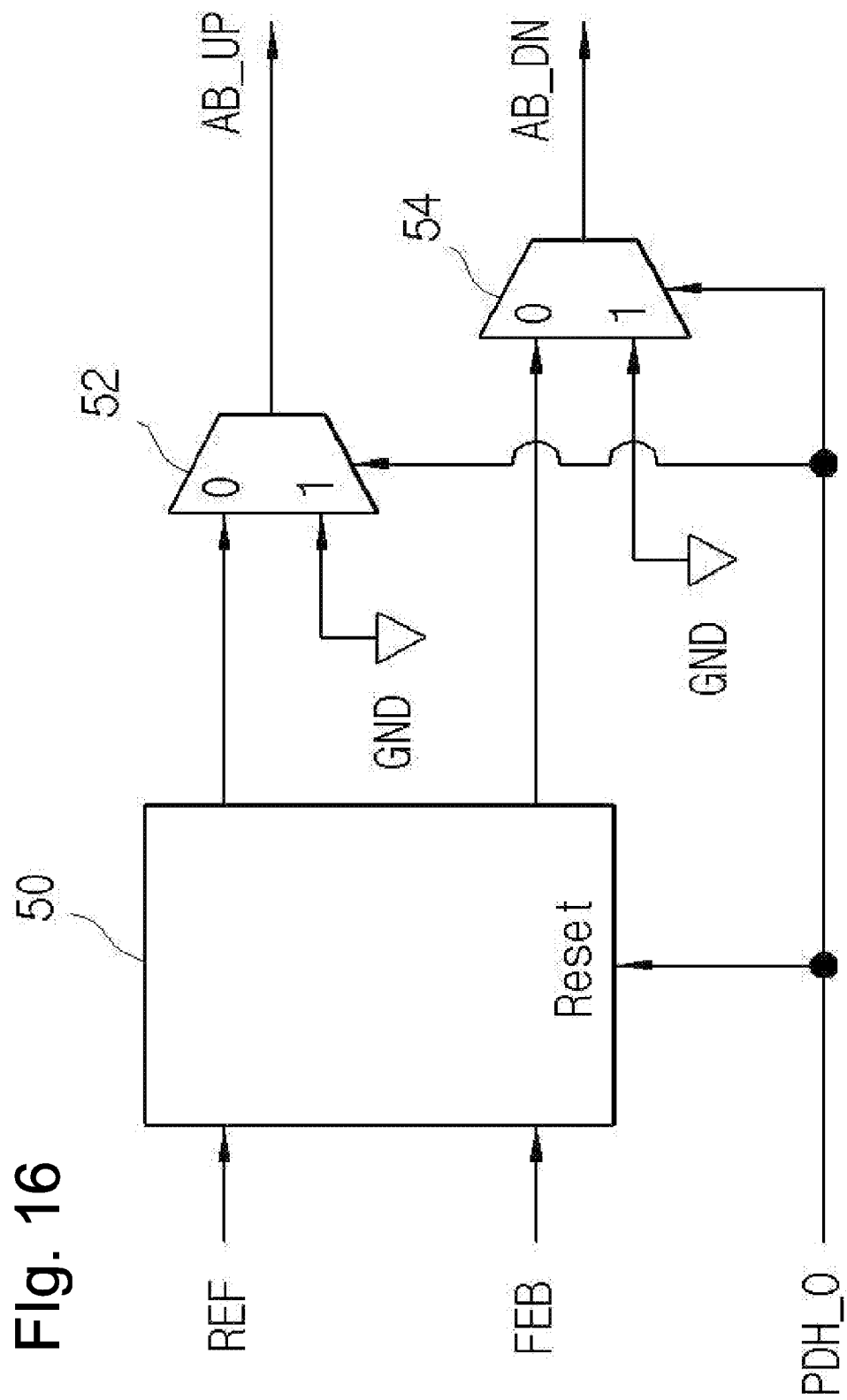
FIG. 16 is a block diagram of a phase detector.
Figure 17:
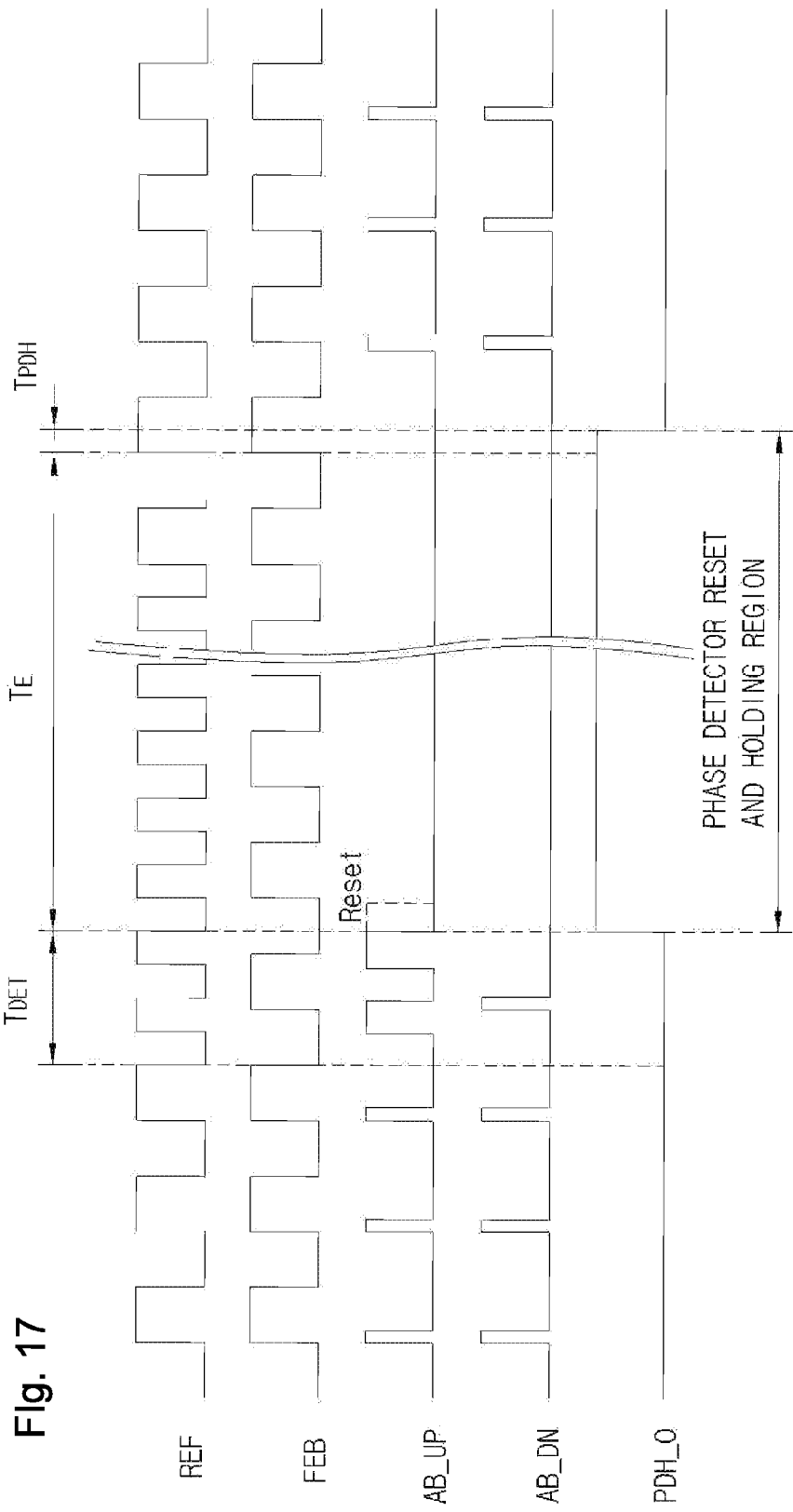
FIG. 17 is a timing diagram of the phase detector of FIG. 16.

FIG. 17 is a timing diagram of the phase detector 10 of FIG. 16.

The phase detector 10 performs the same operation as a common phase frequency detection circuit when the frequency control signal PDH_O is in a logic level LOW '0'.

That is, when the frequency control signal PDH_O is in a logic level LOW '0', the two multiplexers 52 and 54 output signals from the phase frequency detector 50 as the up signal AB_UP and the down signal AB_DN. That is, the two multiplexers 52 and 54 compare the reference clock signal REF and the feedback clock signal FEB with each other and perform a control operation for entering a lock state based on a result of the comparison like in a common PLL.

In contrast, when the frequency control signal PDH_O is in a logic level HIGH (i.e., during the time $T_E$), the two multiplexers 52 and 54 are set to output the up signal AB_UP and the down signal AB_DN as a logic level LOW (or a ground level), and the phase frequency detector 50 is reset.

When both the up signal AB_UP and the down signal AB_DN are in a logic level LOW, the control voltage VCONT generated from the charge pump 20 and the LPF 22 of the oscillation controller 14 continues to maintain a constant voltage level. When the oscillation controller 14 regularly maintains the control voltage VCONT, the oscillation signal VCOOUT generated from the VCO 16 continues to maintain the same frequency.

Accordingly, although an abrupt variation is generated in the frequency of the reference clock signal REF signal, the feedback clock signal FEB continues to maintain the same frequency.

If the delay time $T_{PDH}$ according to the holding signal PHD is not placed when the phase detector 10 compares the reference clock signal REF and the feedback clock signal FEB with each other, an error is generated in the up signal AB_UP and the down signal AB_DN.

That is, if the frequency control signal PDH_O shifts to a logic level LOW at a rising edge of the reference clock signal REF without having the delay time $T_{PDH}$ as shown in FIG. 18(a), the up signal AB_UP generated from the phase detector 10 has a very great pulse width. In FIG. 18(a), the up signal AB_UP and the down signal AB_DN show that a phase difference between the reference clock signal REF and the feedback clock signal FEB was erroneously compared with each other.

Accordingly, if the delay time $T_{PDH}$ is placed as shown in FIG. 18(b), the phase detector 10 can normally generate the up signal AB_UP and the down signal AB_DN by correctly comparing a phase difference between the reference clock signal REF and the feedback clock signal FEB with each other.

Figure 19:
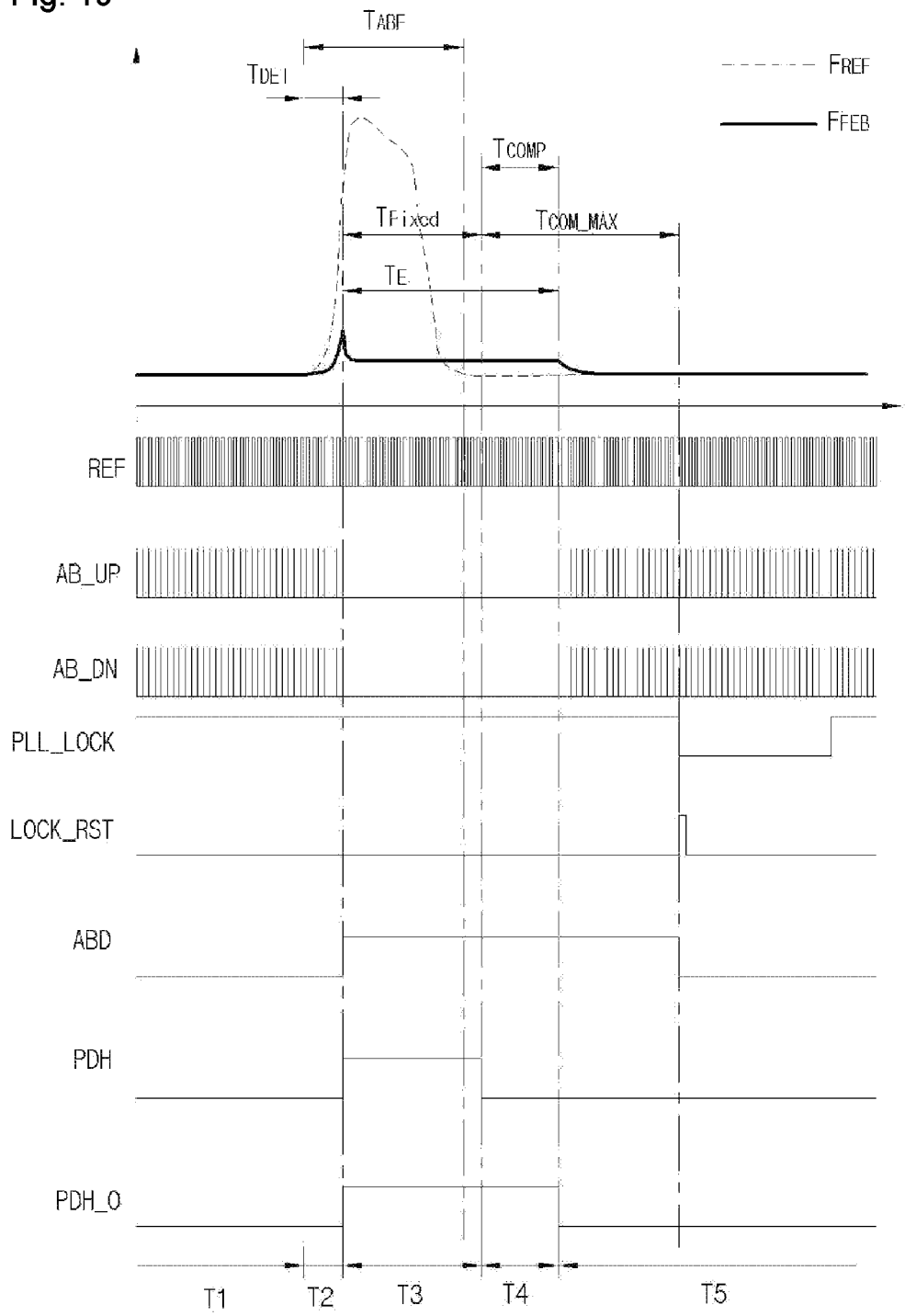
FIG. 19 is a timing diagram of the embodiment of FIG. 2.

The timing diagram of the entire operation of the circuit in accordance with an embodiment of the present invention may be shown in FIG. 19.

In FIG. 19, a region T1 is a normal operation region and is a region in which the circuit in accordance with an embodiment of the present invention is in a lock state by performing the same operation as that of a common PLL before an abrupt variation is generated in the frequency of the reference pulse signal REF.

In FIG. 19, a region T2 is a region in which the circuit in accordance with an embodiment of the present invention detects an abrupt variation in the frequency of the reference pulse signal REF when the abrupt frequency variation is generated.

The abrupt variation in the frequency of the reference pulse signal REF is detected by the frequency variation detector 42 of the frequency controller 12. The detection of the abrupt variation in the frequency of the reference pulse signal REF by the frequency controller 12 has been described with reference to FIG. 12.

In FIG. 19, a region T3 is a region in which the phase detector 10 generates the up signal AB_UP and the down signal AB_DN of a logic level LOW during the fixed time $T_{Fixed}$ so that the control voltage VCONT provided to the VCO 16 maintains a constant level.

Accordingly, the feedback clock signal FEB maintains a constant frequency despite an abrupt variation in the frequency of the reference pulse signal REF as shown in FIG. 19.

In FIG. 19, a region T4 is a region in which whether or not a rising edge of the reference pulse signal REF is present in an interval in which the mask signal MASK generated from the clock output circuit 18 is in a logic level HIGH is determined.

If, as a result of the determination, a rising edge of the reference pulse signal REF is present in the interval in which the mask signal MASK generated from the clock output circuit 18 is in a logic level HIGH, the frequency control signal PDH_O of a logic level LOW is generated.

The interval in which the frequency control signal PDH_O is in a logic level HIGH includes the region T3 and the region T4. During the region T3 and the region T4, the phase detector 10 generates the up signal AB_UP and the down signal AB_DN of a logic level LOW so that the control voltage VCONT applied to the VCO 16 remains constant. As a result, the feedback clock signal FEB generated from the clock output circuit 18 maintains a constant frequency.

When the frequency control signal PDH_O shifts to a logic level LOW, a region T5 is started.

In FIG. 19, the region T5 is a region in which a normal operation is performed and a region in which the same operation as that of a common PLL is performed.

In the region T5, the circuit in accordance with an embodiment of the present invention becomes a lock state while performing the same operation as that of a common PLL. When the circuit in accordance with an embodiment of the present invention becomes the lock state, the lock detection signal PLL_LOCK shifts to a logic level HIGH.

Thereafter, when an abrupt variation is generated again in the frequency of the reference pulse signal REF, the circuit in accordance with an embodiment of the present invention outputs the feedback clock signal FEB whose abrupt frequency variation has been blocked while performing the operations of the region T2, the region T3, the region T4, and the region T5.

In accordance with an embodiment of the present invention, the circuit performing a PLL operation can perform an operation of generating a phase difference signal by comparing the phases of the reference clock signal and the feedback clock signal with each other, generating a feedback clock signal corresponding to the phase difference signal, and regularly maintaining the frequency of the feedback clock signal when an activated frequency control signal is received. To this end, the circuit may be defined to include the phase detector 10, the oscillation controller 14, the VCO 16, and the division circuit 32.

Accordingly, although an abrupt variation is generated in the frequency of the reference pulse signal REF, the abrupt variation generated in the frequency of the reference pulse signal REF can be prevented from being incorporated into an abrupt variation in the frequency of the feedback clock signal FEB.

As described above, in accordance with the present invention, in all systems in which an input clock signal is directly used or a clock signal synchronized with an input clock signal is used, for example, in the timing controller of an LCD, an abrupt variation in the frequency of a clock signal, such as a clean clock signal or an SSC signal, can be blocked. Accordingly, although an abrupt variation is generated in the frequency of an input clock signal, synchronization between the input clock signal and another clock signal can be smoothly maintained. Accordingly, a stable operation in the system can be guaranteed.

As is apparent from the above description, in all systems in which an input clock signal is directly used or a clock signal synchronized with an input clock signal is used, for, example, in the timing controller of an LCD, an abrupt variation in the frequency of a clock signal can be blocked, and synchronization between the clock signal and another clock signal can be smoothly maintained. Accordingly, there is an advantage in that a stable operation of a system using a clock signal can be guaranteed.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A circuit for controlling a variation in a frequency of a clock signal, comprising:
    a phase detector for providing a phase difference signal between a reference clock signal and a feedback clock signal in response to a frequency control signal;
    an oscillation controller for providing a control voltage corresponding to the phase difference signal;
    a Voltage-Controlled Oscillator (VCO) for providing an oscillation signal having a frequency corresponding to the control voltage;
    a clock output circuit for providing the feedback clock signal using the oscillation signal and generating a mask signal comprising information about a phase of the feedback clock signal; and
    a frequency controller for providing the frequency control signal that is activated if a variation in a frequency of the reference clock signal is determined to be out of a set range in a state in which phases of the reference clock signal and the feedback clock signal have been locked, maintaining the activation of the frequency control signal during a predetermined fixed time and a comparison time after the fixed time, and maintaining the comparison time up to a time at which the phase of the reference clock signal is determined to have approached the phase of the feedback clock signal based on the mask signal,
    wherein the phase difference detector regularly maintains the frequency of the feedback clock signal generated from the clock output circuit by controlling the phase difference signal while the frequency control signal is activated.

2. The circuit of claim 1, wherein the phase difference signal comprises an up signal and a down signal corresponding to a phase difference between the reference clock signal and the feedback clock signal.

3. The circuit of claim 1, wherein the phase detector comprises:
    a phase frequency detector configured to compare the phases of the reference clock signal and the feedback clock signal with each other and generate the phase difference signal comprising an up signal and a down signal corresponding to a phase difference between the reference clock signal and the feedback clock signal and reset in response to the activated frequency control signal;
    a first multiplexer configured to select and output any one of the up signal and a logic level LOW in response to the frequency control signal; and
    a second multiplexer configured to select and output any one of the down signal and the logic level LOW in response to the frequency control signal.

4. The circuit of claim 1, wherein the clock output circuit generates the mask signal having a constant phase difference based on an edge of the feedback clock signal.

5. The circuit of claim 3, wherein the clock output circuit generates the mask signal having a pulse width corresponding to a cycle of the oscillation signal.

6. The circuit of claim 1, wherein the clock output circuit comprises:
    a division circuit for generating the feedback clock signal by dividing the oscillation signal; and
    a mask signal generator for generating the mask signal having a constant phase difference based on a rising edge of the feedback clock signal and having a pulse width corresponding to a cycle of the oscillation signal.

7. The circuit of claim 6, wherein the mask signal generator generates the mask signal by comparing the oscillation signal with the feedback clock signal.

8. The circuit of claim 1, wherein the frequency controller comprises:
    a lock detector for comparing the phases of the reference clock signal and the feedback clock signal with each other and providing an activated lock detection signal in response to a state in which the phases have been locked;
    a frequency variation detector for providing a holding signal that remains activated during the fixed time and a frequency variation detection signal that remains activated during a time comprising the fixed time and the comparison time after the fixed time, when a falling edge of the reference clock signal is placed in the phase difference signal that is activated after the lock detection signal is activated; and a control signal generator for providing the frequency control signal that is activated at any one of times at which the frequency variation detection signal and the holding signal are activated and maintaining the activation of the frequency control signal during the comparison time after the activation of the holding signal is terminated.

9. The circuit of claim 8, wherein:
the frequency variation detector provides a lock reset signal at a time at which the activation of the frequency variation detection signal is terminated, and
the lock detector resets the lock detection signal in response to the lock reset signal.

10. The circuit of claim 8, wherein the control signal generator maintains the activation of the frequency control signal up to a time less than at least 'a pulse width of the mask signal/2' from a time at which a rising edge of the reference clock signal is placed in the mask signal that is activated.

11. The circuit of claim 8, wherein the frequency variation detector receives an input signal having a predetermined value and determines a time during which the holding signal and the frequency variation detection signal are activated based on the value of the input signal.

12. The circuit of claim 11, wherein a time at which the activation of the frequency variation detection signal is terminated is set to be placed after a time at which the activation of the frequency control signal is terminated.

13. A circuit for controlling a variation in a frequency of a clock signal, comprising:
a Phase-Locked Loop (PLL) circuit for generating a phase difference signal by comparing phases of a reference clock signal and a feedback clock signal with each other, generating the feedback clock signal corresponding to the phase difference signal, and regularly maintaining a frequency of the feedback clock signal when an activated frequency control signal is received;
a mask signal generator for generating a mask signal comprising information about the phase of the feedback clock signal; and
a frequency controller for determining whether or not the phases of the reference clock signal and the feedback clock signal have been locked by comparing the reference clock signal and the feedback clock signal with each other, generating a holding signal that remains activated during a predetermined fixed time and a frequency variation detection signal that remains activated during a time comprising a comparison time after the fixed time when a frequency of the reference clock signal is out of a predetermined range in a state in which the phases have been locked, and providing the activated frequency control signal that is activated at any one of points of time at which the frequency variation detection signal and the holding signal are activated to the PLL circuit.

14. The circuit of claim 13, wherein:
the PLL circuit comprises a phase detector for providing the phase difference signal by comparing the phases of the reference clock signal and the feedback clock signal in response to the frequency control signal, and
the phase difference detector controls the phase difference signal so that the phase difference signal has a fixed value for regularly maintaining the frequency of the feedback clock signal in response to the activated frequency control signal.

15. The circuit of claim 13, wherein the frequency controller is configured to:
maintain the activation of the frequency control signal during the comparison time during which the phase of the reference clock signal is determined to have approached the phase of the feedback clock signal using the mask signal after the activation of the holding signal is terminated.

16. The circuit of claim 15, wherein the frequency controller resets the lock state of the phases at a time at which the activation of the frequency variation detection signal is terminated.

17. The circuit of claim 13, wherein the frequency controller receives an input signal having a predetermined value and determines a time during which a holding signal and a frequency variation detection signal are activated based on the value of the input signal.

18. The circuit of claim 13, wherein the mask signal generator generates the mask signal having a constant phase difference based on an edge of the feedback clock signal and having a pulse width of "±a cycle of the feedback clock signal/n (n is a natural number)" of the feedback clock signal.

19. The circuit of claim 13, wherein the frequency controller determines that a falling edge of the reference clock signal is placed in the activated phase difference signal when the frequency of the reference clock signal is out of the predetermined range.

* * * * *